(12) United States Patent
Bowlerwell et al.

(10) Patent No.: US 12,040,710 B2
(45) Date of Patent: Jul. 16, 2024

(54) ESTIMATION OF AN INDUCTANCE IN A POWER CONVERTER

(71) Applicant: Cirrus Logic International Semiconductor Ltd., Edinburgh (GB)

(72) Inventors: John B. Bowlerwell, Dunfermline (GB); Alastair M. Boomer, Edinburgh (GB); Holger Haiplik, Swindon (GB); Malcolm Blyth, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 212 days.

(21) Appl. No.: 17/699,269

(22) Filed: Mar. 21, 2022

(65) Prior Publication Data

US 2023/0198396 A1 Jun. 22, 2023

Related U.S. Application Data

(60) Provisional application No. 63/292,177, filed on Dec. 21, 2021.

(30) Foreign Application Priority Data

Jan. 20, 2022 (GB) ..................................... 2200734

(51) Int. Cl.
　　*H02M 3/158*　　(2006.01)
　　*G01R 27/26*　　(2006.01)
　　*H02M 1/00*　　(2006.01)

(52) U.S. Cl.
　　CPC ......... *H02M 3/158* (2013.01); *G01R 27/2611* (2013.01); *H02M 1/0009* (2021.05)

(58) Field of Classification Search
　　CPC .. H02M 3/158; H02M 1/0009; G01R 27/2611
　　See application file for complete search history.

(56) References Cited

U.S. PATENT DOCUMENTS

| 7,710,084 B1 | 5/2010 | Guo |
| 2005/0026358 A1 | 2/2005 | Fujiwara et al. |

(Continued)

FOREIGN PATENT DOCUMENTS

WO　　2022020064 A1　　1/2022

OTHER PUBLICATIONS

Combined Search and Examination Report under Sections 17 and 18(3), UKIPO, Application No. GB2200734.8, mailed Jul. 13, 2022.

(Continued)

*Primary Examiner* — Rafael O Leon De Domenech
(74) *Attorney, Agent, or Firm* — Jackson Walker L.L.P.

(57) ABSTRACT

Circuitry for estimating an inductance of an inductor in power converter circuitry, the circuitry comprising: circuitry for generating a peak inductor current signal indicative of a peak inductor current during an operational cycle of the power converter circuitry; circuitry for generating a ripple current estimate signal, indicative of an estimate of a ripple current in the power converter circuitry; and circuitry for applying the ripple current estimate signal to the peak inductor current signal to generate an average inductor current threshold signal indicative of an estimated average inductor current in the power converter circuitry during the operational cycle, wherein the ripple current estimate signal is based on: a duration of a charging phase of operation of the power converter circuitry; a voltage across the inductor; and an inductance value for the inductor; and wherein the circuitry for generating the ripple current estimate signal is operative to select an inductance value for the inductor for which the estimated average inductor current is equal to an actual average inductor current during the operational cycle to generate a value for the actual inductance of the inductor.

18 Claims, 15 Drawing Sheets

(56) References Cited

U.S. PATENT DOCUMENTS

2005/0206358 A1    9/2005    Van Der Horn et al.
2017/0040895 A1*   2/2017    May .................... G01R 19/165
2018/0063910 A1    3/2018    Schoenberger et al.
2019/0386561 A1*  12/2019   King ...................... H02M 1/42

OTHER PUBLICATIONS

International Search Report and Written Opinion of the International Searching Authority, International Application No. PCT/GB2022/053022, mailed Feb. 20, 2023.

* cited by examiner

ESTIMATION OF AN INDUCTANCE IN A POWER CONVERTER

FIELD OF THE INVENTION

The present disclosure relates to estimation of an inductance of an inductor in a power converter such as a boost converter.

BACKGROUND

Portable electronic devices such as mobile phones, laptop and tablet computers, smartwatches etc. typically include a power source such as an on-board battery to power the various components and subsystems of the portable electronic device.

Some components or subsystems of a portable electronic device may require a supply voltage that is greater than the output voltage of the on-board battery. For example, in order to provide a desired output signal amplitude range for driving an output transducer (e.g. loudspeaker that is used to output sound such as music, speech and the like, a haptic transducer such as a resonant actuator, or an ultrasonic transducer) an amplifier subsystem may require a supply voltage that is greater than the maximum output voltage of the on-board battery.

Thus, a boost converter may be provided in such devices, to convert the output voltage of the on-board battery to a higher voltage that is suitable for use as a supply for such components and subsystems. A boost converter is sometimes referred to as a step-up converter in the art since it "steps up" the source voltage.

FIG. 1 provides a simplified schematic representation of example boost converter circuitry and a graph illustrating current flowing through an inductor of the boost converter circuitry in operation of the boost converter circuitry.

The boost converter circuitry (shown generally at 100 in FIG. 1) essentially includes an inductor 110, a reservoir capacitor 120, a first controllable switch device 130 (which in this example is an n-channel MOSFET), a second controllable switch device 140 (which in this example is a p-channel MOSFET), and control circuitry 150 for controlling the operation of the first and second controllable switch devices (referred to hereinafter simply as switches) 130, 140.

The inductor 110 is coupled in series between a positive terminal of a battery 160 or other power source of a host device (e.g. a mobile phone or the like) that provides a supply voltage VDD_B and a drain terminal of the first switch 130. A source terminal of the first switch 130 is coupled to a ground or other reference voltage supply rail (hereinafter referred to as ground, for simplicity), and a gate terminal of the first switch 130 is coupled to a first output of the control circuitry 150 so as to receive a control signal from the control circuitry 150.

A drain terminal of the second switch 140 is coupled to the inductor 110 and a source terminal of the second switch 140 is coupled to a first terminal of the reservoir capacitor 120. A gate terminal of the second switch 140 is coupled to a second output of the control circuitry 150 so as to receive a control signal from the control circuitry 150. The second terminal of the reservoir capacitor 120 is coupled to ground.

In operation of the boost converter circuitry 100, the first and second switches 130, 140 are controlled so as to repeatedly couple one terminal of the inductor 110 to ground and then to the reservoir capacitor 120, such that energy can be transferred from the inductor 110 to the reservoir capacitor 120 to increase an output voltage VBST across the reservoir capacitor 120 to a level that is greater than the supply voltage VDD_B.

In a first, charging, phase $\phi_1$ of operation of the circuitry 100, the control circuitry 150 outputs control signals to the first and second switches 130, 140 to switch the first switch 130 on, and to switch the second switch 140 off. Thus, during a first time period between a first time $t_0$ and a second time $t_1$, a current path exists from the battery 160 to ground through the inductor 110, and an increasing current $I_L$ flows through the inductor 110, as shown in the graph of FIG. 1. As a result of the increasing inductor current $I_L$, the inductor stores some energy by generating a magnetic field.

In a second, discharging, phase $\phi_2$, of operation of the circuitry 100, the control circuitry 150 outputs control signals to the first and second switches 130, 140 to switch the first switch 130 off, and to switch the second switch 140 on. Thus, during a second time period between the second time $t_1$ and a third time $t_2$, current can no longer flow through the inductor 110 to ground through the first switch 130. The current in the inductor 110 must keep flowing, and therefore flows into the reservoir capacitor 120, causing the voltage $V_{RES}$ across the reservoir capacitor 120 to increase. If $V_{RES}$ is smaller than VDD_B the current in the inductor 110 will continue to increase, hence charging the reservoir capacitor 120. If $V_{RES}$ is greater than VDD_B the current in the inductor 110 will start decreasing, but because the current is still positive the voltage $V_{RES}$ across the reservoir capacitor 120 will continue to increase further.

By repeating the charging phase $\phi_1$ and the discharging phase $\phi_2$ a number of times, the reservoir capacitor 120 can be charged to a level at which the voltage $V_{RES}$ across the reservoir capacitor 120 is greater than the voltage VDD_B output by the battery 160 and is thus suitable for supplying downstream components or subsystems such as amplifier circuitry or the like that require a greater voltage than can be provided by the battery 160 alone.

A rate of change $dI_L/dt$ of the inductor current $I_L$ is determined by the voltage across the inductor 110 and the inductance L of the inductor 110.

Thus, during the charging phase $\phi_1$:

$$dI_L/dt = (VDD\_B - 0)/L, \quad (1)$$

during the discharge phase:

$$\phi_2, dI_L/dt = (VDD\_B - VBST)/L. \quad (2)$$

The inductance L of the inductor 110 can thus be expressed as:

$$L = (dt \times VDD\_B)/di, \text{ for the charging phase } \phi_1; \text{ and} \quad (3)$$

$$L = (dt \times (VDD\_B - VBST))/di, \text{ for the discharge phase } \phi_2. \quad (4)$$

In a continuous conduction mode (CCM) of operation of the circuitry 100 (as illustrated in FIG. 2), each charging phase $\phi_1$ is immediately followed by a discharging phase $\phi_2$, and each discharging phase 2 is immediately followed by a charging phase $\phi_1$. Thus, each operational cycle of the circuitry 100 consists of a charging phase $\phi_1$ immediately followed by a discharging phase $\phi_2$, such that there is a continuous inductor current during operation of the circuitry 100.

In contrast, in a discontinuous conduction mode (DCM) of operation of the circuitry 100 (as illustrated in FIG. 3), each discharging phase $\phi_2$ is followed by a zero-current phase $\phi_3$, during which both the first switch 130 and the second switch 140 are switched off, such that no current flows through the inductor 110. Thus, each operational cycle of the circuitry 100 consists of a charging phase φ1 immediately followed by a discharging phase φ2, immediately followed by a zero-current phase φ3.

In many applications in which boost converter circuitry of the kind shown in FIG. 1 is employed, it is beneficial to be able to monitor the average current through the inductor per operational cycle of the circuitry 100 (hereinafter referred to as the "cycle average inductor current"), in order to regulate the cycle average inductor current in accordance with a target average current value, for example to prevent conditions in which an excessive amount of current is drawn from a battery or other power source.

It is also beneficial to know the actual inductance L of the inductor 110, for example to detect if the inductor 110 is derating beyond acceptable limits as a result of inductor saturation current, or to detect if the actual inductance L differs from a rated or nominal inductance by an amount that exceeds some predefined threshold.

SUMMARY

According to a first aspect, the invention provides circuitry for estimating an inductance of an inductor in power converter circuitry, the circuitry comprising:
circuitry for generating a peak inductor current signal indicative of a peak inductor current during an operational cycle of the power converter circuitry;
circuitry for generating a ripple current estimate signal, indicative of an estimate of a ripple current in the power converter circuitry; and
circuitry for applying the ripple current estimate signal to the peak inductor current signal to generate an average inductor current threshold signal indicative of an estimated average inductor current in the power converter circuitry during the operational cycle,
wherein the ripple current estimate signal is based on:
a duration of a charging phase of operation of the power converter circuitry;
a voltage across the inductor; and
an inductance value for the inductor;
and wherein the circuitry for generating the ripple current estimate signal is operative to select an inductance value for the inductor for which the estimated average inductor current is equal to an actual average inductor current during the operational cycle to generate a value for the actual inductance of the inductor.

The circuitry for generating the ripple current estimate signal may be operative to adjust the inductance value in discrete steps, and to select the inductance value for which the estimated average inductor current is equal to the actual average inductor current.

The circuitry for generating the ripple current estimate signal may be operative to select the inductance value for the inductor based on:
a ripple current estimate determined based on a difference between the peak inductor current and the actual average inductor current;
the duration of the charging phase of operation of the power converter circuitry; and
the supply voltage to the power converter circuitry.

The circuitry for generating the ripple current estimate signal may be operative to select the inductance value for the inductor based on a predetermined relationship between the ripple current estimate and a change in the inductance value that would cause the estimated average inductor current to be equal to an actual average inductor current during the operational cycle.

The circuitry may further comprise comparison circuitry for generating a signal indicative of whether the actual average inductor current differs from the estimated average inductor current.

The comparison circuitry may be configured to compare:
a first period equal to half the duration of a charging or discharging phase of the power converter circuitry,
a second period equal to a time taken for the inductor current in the power converter circuitry to reach the average current threshold.

The comparison circuitry may be configured to compare:
a first period equal to a duration of a charging or discharging phase of the power converter circuitry;
to a second period equal to twice the time taken for the inductor current in the power converter circuitry to reach the average current threshold.

The comparison circuitry may comprise digital counter circuitry configured to generate a first count value indicative of the first period and a second count value indicative of the second period.

The comparison circuitry may further comprise digital comparison circuitry operative to compare the first count value to the second count value and to generate a comparator output signal based on the comparison.

The comparison circuitry may further comprise current monitor circuitry configured to generate a signal indicative of the actual inductor current.

The circuitry for generating the peak inductor current signal may comprise control circuitry configured to receive a first signal indicative of a target output voltage and a second signal indicative of an actual output voltage of the power converter circuitry and to generate the peak inductor current signal based on the first and second received signals.

The circuitry for applying the ripple current estimate signal may be configured to generate and apply an additional DC voltage to the peak inductor current signal.

The circuitry may further comprise comparator circuitry configured to compare a signal indicative of the actual average inductor current during operation of the power converter circuitry to a threshold that is based on the average inductor current threshold signal.

The control circuitry, the circuitry for applying the ripple current estimate signal, and the comparator circuitry may form a control loop for regulating an output voltage of the power converter circuitry.

The power converter circuitry may comprise boost converter circuitry.

According to a second aspect, the invention provides an integrated circuit comprising circuitry according to the first aspect.

According to a third aspect, the invention provides a host device comprising circuitry according to the first aspect.

The host device may comprise a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console a VR or AR device, a mobile telephone, a portable audio player or other portable device.

BRIEF DESCRIPTION OF THE DRAWINGS

Embodiments of the invention will now be described, strictly by way of example only, with reference to the accompanying drawings, of which.

DETAILED DESCRIPTION

Figure 1:
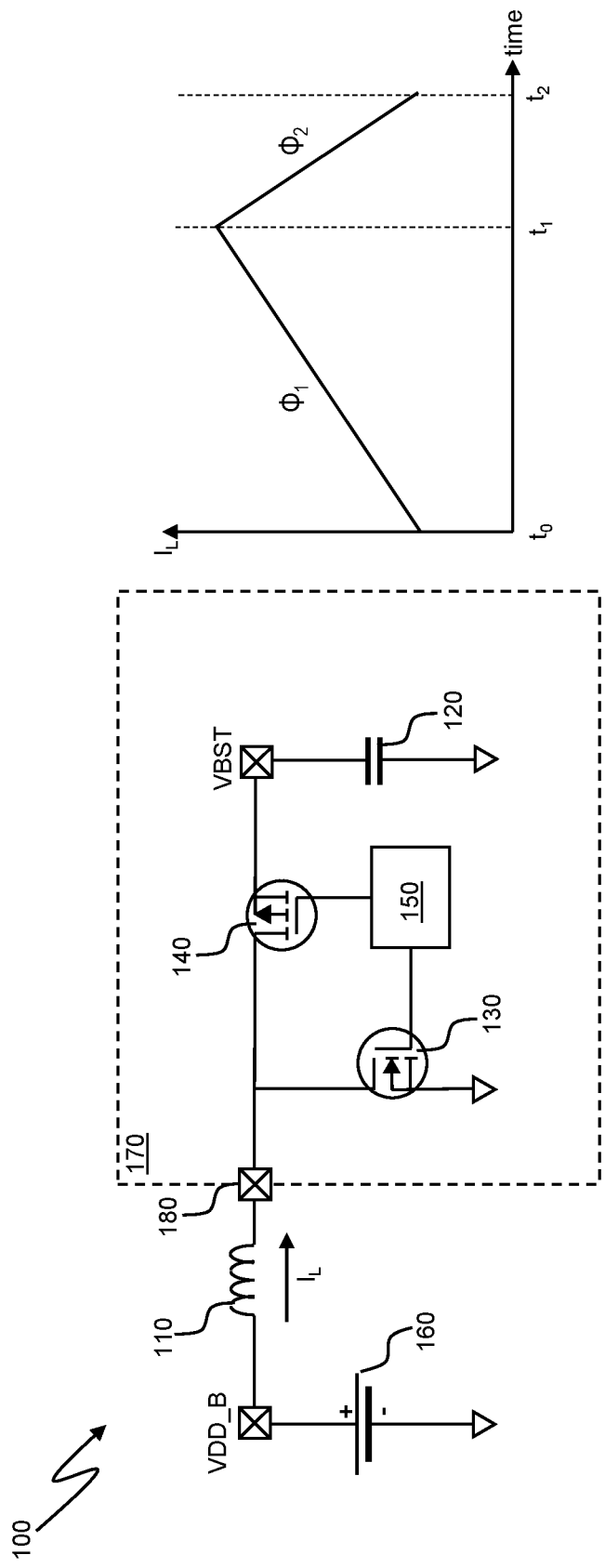
FIG. 1 is a simplified schematic representation of example boost converter circuitry and a graph illustrating current flowing through an inductor of the boost converter circuitry in operation of the boost converter circuitry.

In operation of boost converter circuitry of the kind shown in FIG. 1, an output voltage of the boost converter circuitry 100 may be regulated by altering the duty cycle of the first switch 130. For example, if the output voltage is lower than a target output voltage in one operational cycle of the boost converter circuitry, a control loop may increase a threshold level that is used to control the peak inductor current in one or more subsequent operational cycles in order to cause the first switch 130 to switch off later in the subsequent cycle(s), thus increasing the duty cycle of the first switch to increase the current through the inductor during the charging phase φ1 in the subsequent cycle(s), thereby increasing the amount of energy that is stored in the inductor 110 and transferred to the capacitor 120 on an operational cycle by operational cycle basis, and therefore the output voltage and boost ratio (i.e. the ratio of the output voltage VBST of the boost converter circuitry 100 to the supply voltage VDD_B).

Figure 4:
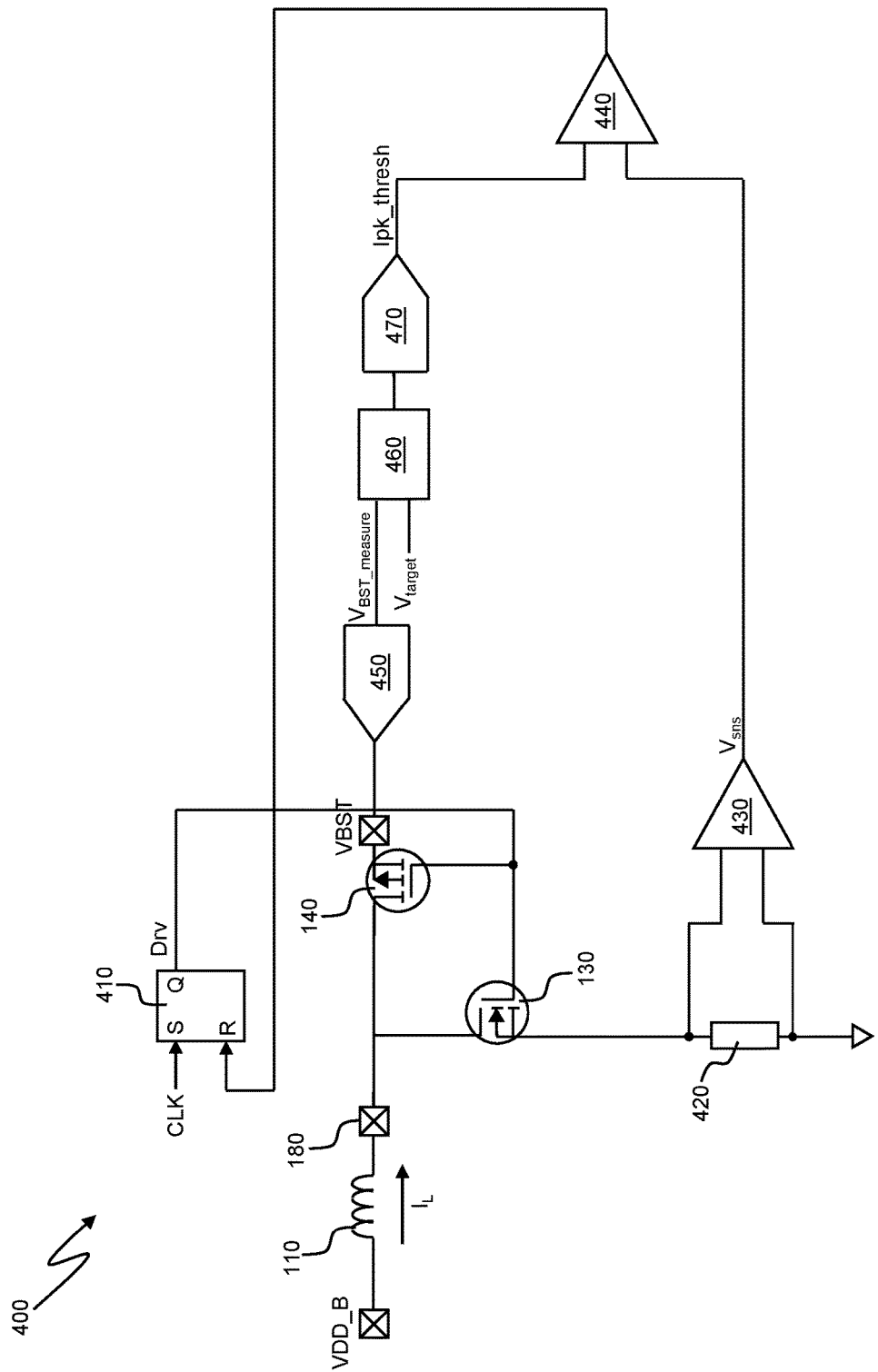
FIG. 4 is a schematic representation of boost converter circuitry having a control loop for regulating its output voltage.

FIG. 4 is a schematic representation of example boost converter circuitry having a control loop to regulate its output voltage.

The boost converter circuitry, shown generally at 400 in FIG. 4, includes a number of elements in common with the boost converter circuitry 100 of FIG. 1. Such common elements are denoted by common reference numerals and will not be described again here. Furthermore, in FIG. 4 and subsequent figures, where appropriate, the reservoir capacitor 120 is not shown, for reasons of clarity and brevity.

The boost converter circuitry 400 includes controller circuitry 410 for controlling the operation of the first and second switches 130, 140. In the example shown in FIG. 4 the controller circuitry 410 comprises SR flip flop circuitry having a set (S) input which receives a clock signal CLK, a reset (R) input, and an output Q which is coupled to the gate terminals of the first and second switches 130, 140 so as to provide a gate drive signal Drv to each of the first and second switches 130, 140. However, it will be appreciated by those of ordinary skill in the art that the controller circuitry 410 may be implemented in other ways. In particular, in some examples the controller circuitry 410 may be operative to control the operation of the first and second switches 130, 140 independently, by outputting a charging phase gate drive signal Drv_chg to the first switch 130 and outputting a discharging phase gate drive signal Drv_dischg (which is different from the charge gate drive signal Drv_chg) to the second switch 140.

The boost converter circuitry 400 further includes current sensing circuitry which, in the illustrated example, comprises a current sense resistance 420 (e.g. a resistor) and amplifier circuitry 430. Those of ordinary skill in the art will appreciate that other implementations of current sensing circuitry are possible.

The current sense resistance 420 is coupled between a source terminal of the first switch 130 of the boost converter circuitry 100 and a ground or other reference voltage supply. First and second inputs of the amplifier circuitry 430 are coupled to first and second terminals of the current sense resistance 420, and the amplifier circuitry 430 thus generates an output signal Vsns indicative of an instantaneous current through the inductor 110 when the first switch 130 is turned on. An output of the amplifier circuitry 430 is coupled to a first input of comparator circuitry 440.

The boost converter circuitry 400 further includes analog to digital converter (ADC) circuitry 450 having an input coupled to the source terminal of the second switch 140 so as to receive the output voltage VBST of the boost converter circuitry 400. The ADC circuitry 450 thus generates a digital output signal $V_{BST\_measure}$ representing the output voltage VBST of the boost converter circuitry 400, which is stored on the reservoir capacitor 120 (not shown in FIG. 4).

An output of the ADC circuitry 450 is coupled to a first input of digital control circuitry 460, such that the digital control circuitry 460 receives the digital output signal $V_{BST\_measure}$ generated by the ADC circuitry 450. A second input of the digital control circuitry 460 receives a digital signal $V_{target}$ representing a target output voltage of the boost converter circuitry 100. The digital control circuitry 460 is operative to compare $V_{BST\_measure}$ to $V_{target}$ and to output a digital signal based on this comparison.

An output of the digital control circuitry 460 is coupled to an input of digital to analog converter (DAC) circuitry 470. The DAC circuitry 470 is configured to convert the digital signal output by the digital control circuitry 460 into an analog output voltage signal Ipk_thresh, which represents a peak inductor current threshold.

An output of the DAC circuitry 470 is coupled to a second input of the comparator circuitry 440, and an output of the comparator circuitry 440 is coupled to the reset (R) input of the controller circuitry 410.

The comparator circuitry 440 is thus operative to compare the instantaneous inductor current, as represented by $V_{sns}$, to the peak inductor current threshold, as represented by Ipk_thresh, and to output a control signal to the controller circuitry 410 based on the comparison.

Figure 5:
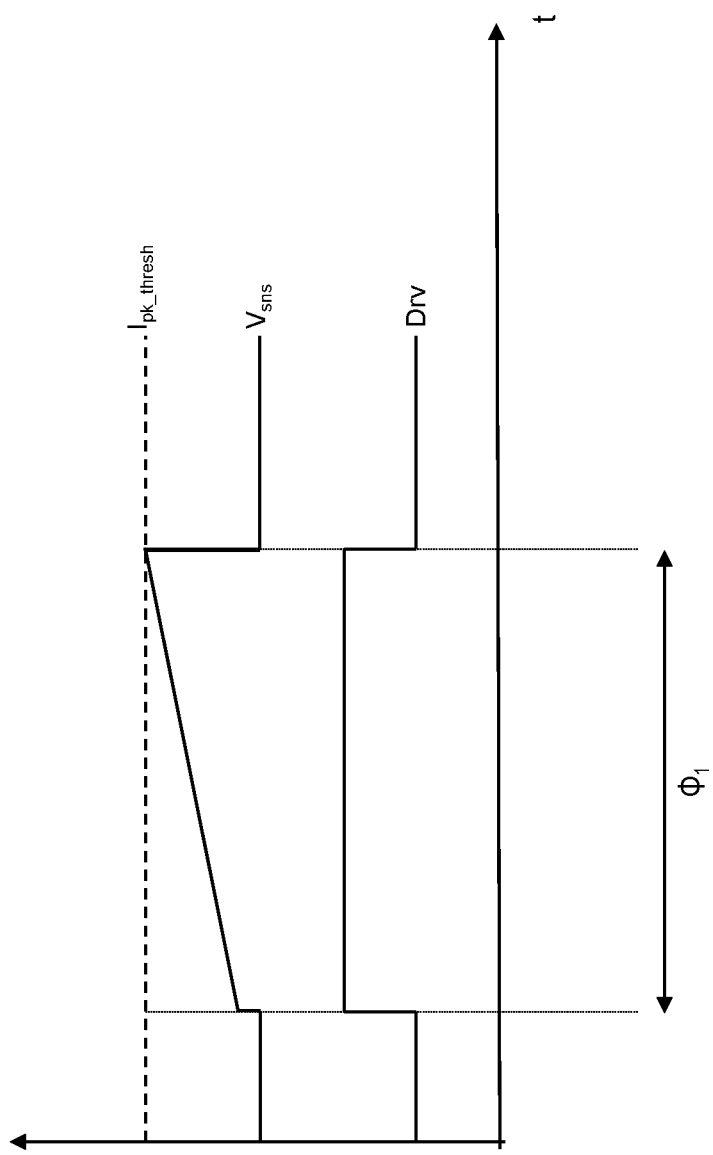
FIG. 5 is a schematic representation of signals in the boost converter circuitry of FIG. 4 during operation thereof.

As shown in the signal diagram of FIG. 5, in operation of the boost converter circuitry 400, in response to a first clock pulse of the clock signal CLK received at its set (S) input, the controller circuitry 410 outputs the gate drive signal Drv to switch on the first switch 130 to cause the inductor 110 to start charging. The signal Vsns output by the amplifier circuitry 430 increases as the inductor current increases, and is compared by the comparator circuitry 440 to the signal Ipk_thresh output by the ADC circuitry 450.

When Vans meets Ipk_thresh, a signal output by the comparator circuitry 440 changes from a first state (e.g. a low logic state) to a second state (e.g. a high logic state), causing the controller circuitry 410 to stop outputting the gate drive signal Drv, causing the first switch 130 to switch off and the second switch 140 to switch on, to discharge the inductor 110 into a load (not illustrated) that is coupled to the boost converter circuitry 400.

The digital control circuitry 460 compares $V_{BST\_measure}$ (which is indicative of the output voltage of the boost converter circuitry 400) to $V_{target}$, and adjusts its output signal according to this comparison. For example, if $V_{BST\_measure}$ is less than $V_{target}$, the digital control circuitry 460 increases a value of its output signal such that Ipk_thresh is also increased. This has the effect of increasing the on-time of the first switch 130 (since, for a given level of inductor current at the beginning of a charging phase $\phi_1$, the greater Ipk_thresh the longer it will take for $V_{SNS}$ to reach Ipk_thresh) and thus increasing the boost ratio of the boost converter circuitry 400. Conversely, if $V_{BST\_measure}$ is greater than $V_{target}$, the digital control circuitry 460 reduces the value of its output signal such that Ipk_thresh is also reduced, thereby reducing the on-time of the first switch 130 and thus reducing the boost ratio.

Thus the combination of the current sense circuitry (i.e. the resistance 420 and amplifier circuitry 430), comparator circuitry 440, ADC circuitry 450, digital control circuitry 460 and DAC circuitry 470 constitutes a control loop which is operative to control a duty cycle of the first switch 130 so as to regulate the output voltage of the boost converter circuitry 400 based on a loop variable, which in the example illustrated in FIG. 4 is the peak current threshold represented by the signal Ipk_thresh.

It may be advantageous to add additional components to the Ipk_thresh signal that are not associated with the output voltage control loop described above with reference to FIG. 4.

Figure 6:
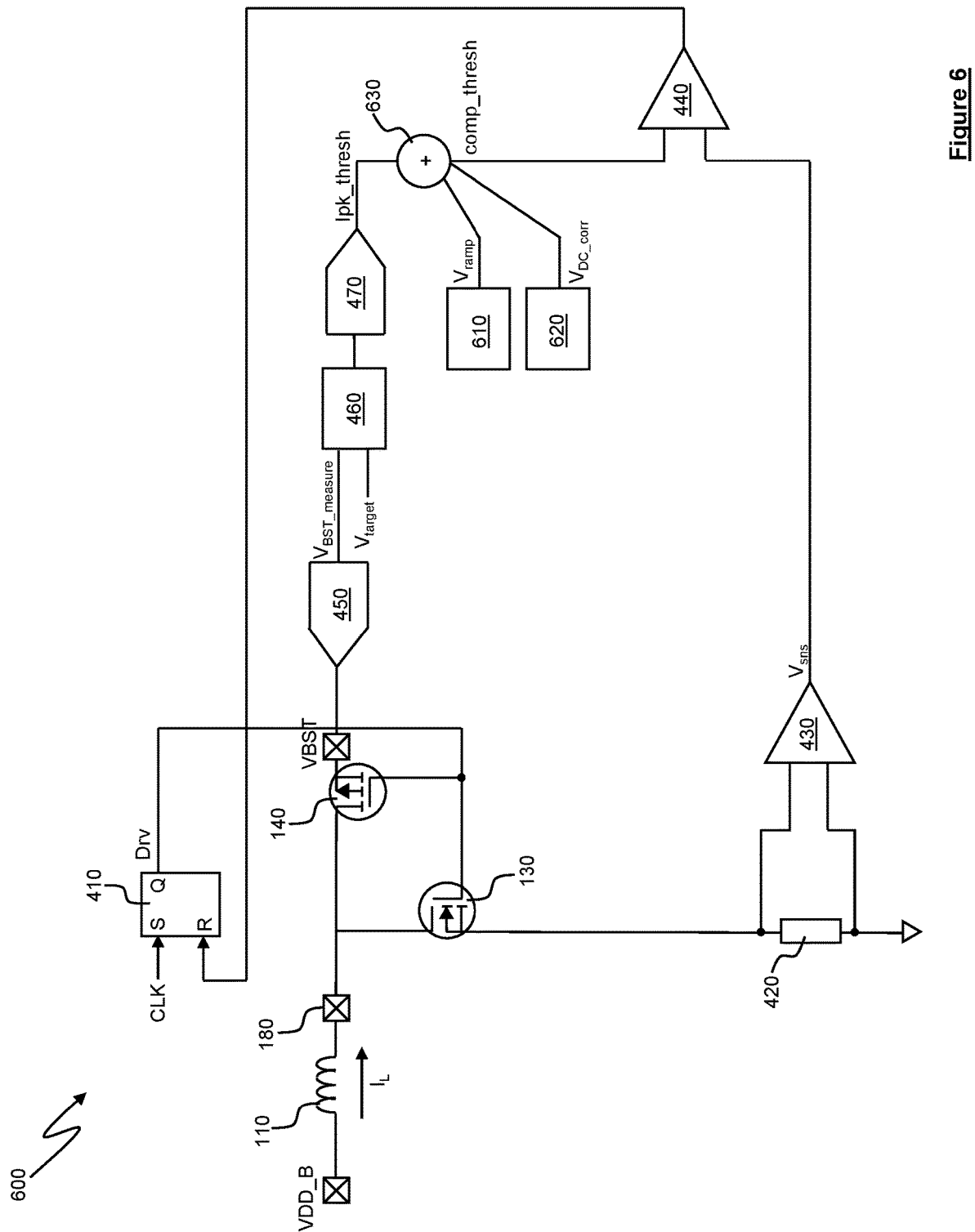
FIG. 6 is a schematic representation of alternative boost converter circuitry having a control loop.

FIG. 6 is a schematic representation of boost converter circuitry that includes circuitry for slope compensation to stabilise the response of the loop to any perturbation in the system.

The boost converter circuitry, shown generally at 600 in FIG. 6, includes a number of elements in common with the boost converter circuitry 400 of FIG. 4. Such common elements are denoted by common reference numerals in FIGS. 4 and 6, and will not be described again here.

Figure 7:
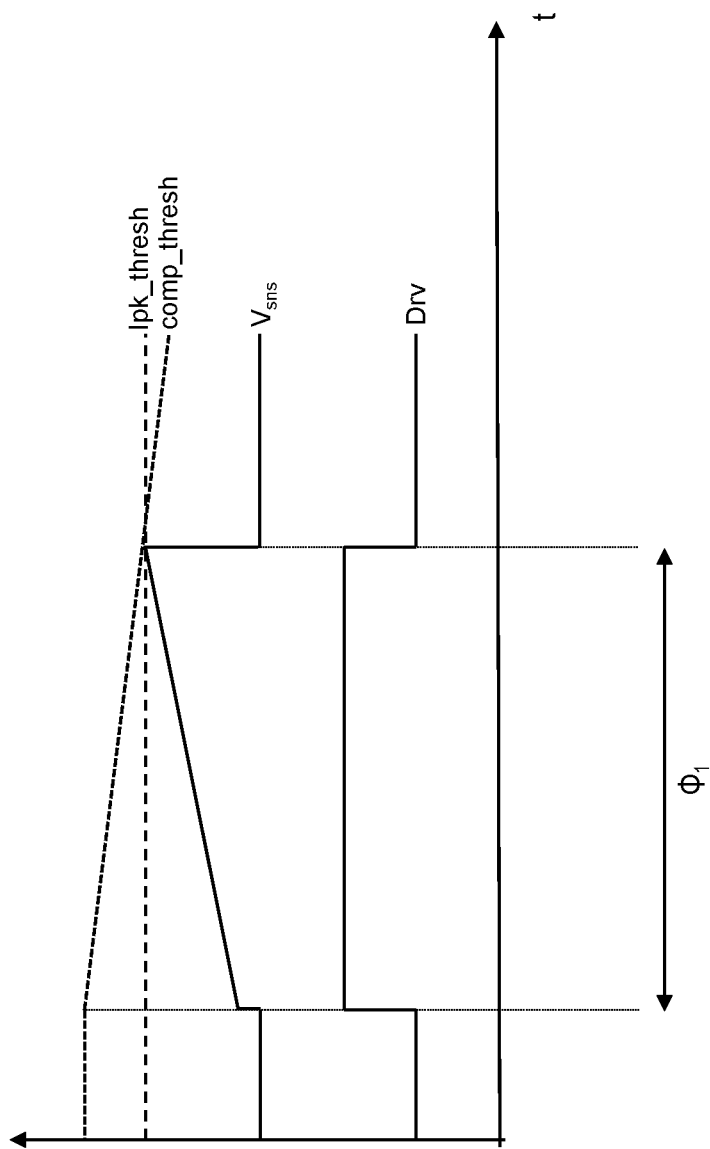
FIG. 7 is a schematic representation of schematic representation of signals in the boost converter circuitry of FIG. 6 during operation thereof.

The boost converter circuitry 600 includes ramp generator circuitry 610 configured to generate a ramp voltage $V_{ramp}$ that decreases over the course of an operational cycle of the boost converter circuitry 600, and DC correction voltage generator circuitry 620 configured to output a DC voltage $V_{DC\_corr}$. First adder circuitry 630 is configured to receive the Ipk_thresh signal from the DAC circuitry 470, the decreasing ramp voltage $V_{ramp}$, and the DC voltage $V_{DC\_corr}$, and to output a comparison threshold signal comp_thresh. Thus, as shown in the signal diagram of FIG. 7, the signal comp_thresh reduces over time, but has a DC component (provided by the DC voltage $V_{DC\_corr}$) that brings comp_thresh up to the correct level for regulating the output voltage of the boost converter circuitry 600.

The comparator circuitry 440 in this example is thus operative to compare the instantaneous inductor current, as represented by $V_{sns}$, to the comparison threshold signal comp_thresh (which in this example is based on the peak inductor current threshold, as represented by Ipk_thresh, since comp_thresh is equal to Ipk_thresh+$V_{ramp}$+$V_{DC\_corr}$), and to output a control signal to the controller circuitry 410 based on the comparison.

In the example circuitry illustrated in FIG. 6, slope compensation is implemented by adding a decreasing ramp signal to the peak current threshold, but it will be appreciated by those of ordinary skill in the art that other approaches are possible. For example, in an alternative implementation an increasing ramp signal could be added to the signal Vsns to achieve a similar slope compensation effect.

As will be appreciated, in the circuitry 600 the control loop again controls the duty cycle of the first switch 130 so as to regulate the output voltage of the boost converter circuitry 600 based on the peak current threshold represented by the signal Ipk_thresh.

Figure 8:
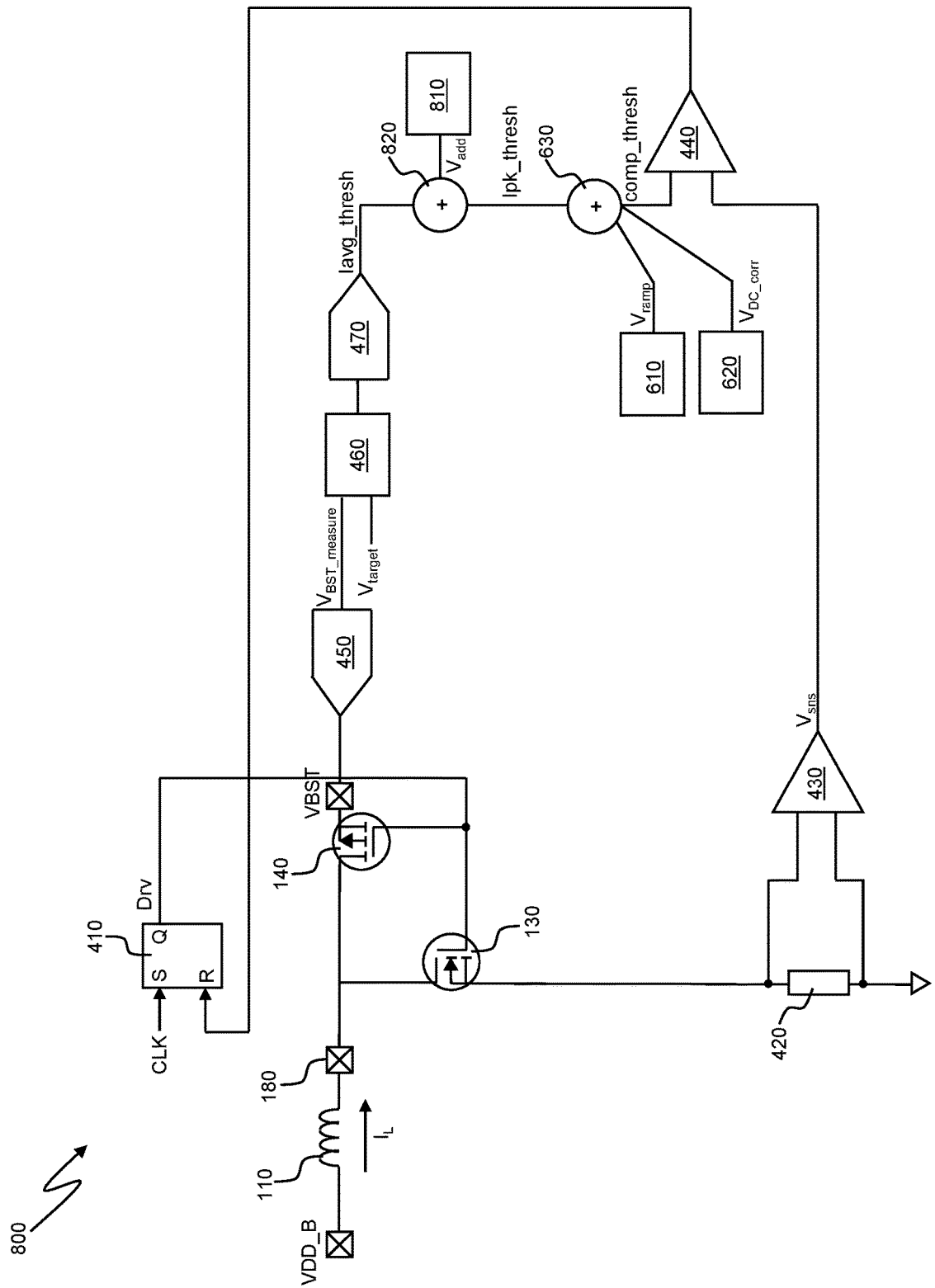
FIG. 8 is a schematic representation of further alternative boost converter circuitry having a control loop.

FIG. 8 is a schematic representation of boost converter circuitry that includes further additional circuitry for adding a DC voltage that is equal to the difference between the average inductor current and the peak inductor current, in order to produce a signal indicative of the requested or target average inductor current.

The boost converter circuitry, shown generally at 800 in FIG. 8, includes a number of elements in common with the boost converter circuitry 600 of FIG. 6. Such common elements are denoted by common reference numerals in FIGS. 6 and 8, and will not be described again here. It is to be noted that the slope compensation circuitry (e.g. the ramp generator circuitry 610 and the DC correction voltage generator circuitry 620 of FIG. 6) could be omitted from the boost converter circuitry 800.

The boost converter circuitry 800 includes additional DC voltage generator circuitry 810 and second adder circuitry 820 for adding an additional DC voltage $V_{add}$, corresponding to a difference between the average inductor Iavg current in an operational cycle of the boost converter circuitry 800 and a peak inductor current Ipk in the operational cycle, to the signal output by the DAC circuitry 470.

The difference between the average inductor current Iavg and the peak inductor current can be calculated as half of a ripple current Iripple. The ripple current Iripple in steady state operation of the boost converter circuitry is defined by the voltage VDD_B (or more accurately, a voltage across the inductor 110, which is based on VDD_B), the inductance L of the inductor 110 and the charging period of the inductor 110. These quantities are known (to at least a first order approximation) by the digital control circuitry 460. These quantities can be provided to the additional DC voltage generator circuitry 810, which can estimate the ripple current Iripple (as Iripple=(VDD_B×Ton)/L, where Ton is the duration for which the first switch 130 is on during the charging phase $\phi_1$—i.e. the duration of the charging phase $\phi_1$), and hence the difference between the average inductor current and the peak inductor current can be estimated by the additional DC voltage generator circuitry 810 as Iripple/2, and the additional DC voltage $V_{add}$ can be generated and output by the additional voltage generator circuitry 810 based on the Iripple/2 estimate.

The addition of the additional DC voltage $V_{add}$ and the operation of the control loop cause the digital control circuitry 460 to modify its output signal, reducing it to a level that is representative of an average current threshold, rather than the peak current threshold, which is instead represented by the signal output by the second adder circuitry 820. Thus (once the control loop has settled to a steady state), a signal Iavg_thresh representing an average inductor current is output by the DAC circuitry 470, a signal Ipk_thresh (which is equal to Iavg_thresh+$V_{add}$) is output by the second adder circuitry 820, and a comparison threshold signal comp_thresh (which is equal to Iavg_thresh+$V_{add}$+$V_{ramp}$+$V_{DC\_corr}$) is output by the first adder circuitry 630. Alternatively (and equivalently), a single instance of adder circuitry with four inputs may replace the first and second adder circuitry 630, 820. This four-input adder circuitry would receive the signals Iavg_thresh, $V_{add}$, $V_{ramp}$, $V_{DC\_corr}$ and output the comparison threshold signal comp_thresh.

The comparator circuitry 440 in this example is thus operative to compare the instantaneous inductor current, as represented by $V_{sns}$, to the comparison threshold signal comp_thresh (which in this example is based on the average inductor current threshold, as represented by Iavg_thresh, since the comparison threshold signal comp_thresh is equal to the sum of Iavg_thresh+$V_{add}$+$V_{ramp}$+$V_{DC\_corr}$), and to output a control signal to the controller circuitry 410 based on the comparison.

Thus, in the circuitry 800, the control loop is again operative to control the duty cycle of the first switch 130 so as to regulate the output voltage of the boost converter circuitry 600 based on a loop variable, but in this example the loop variable is the average current threshold represented by the signal Iavg_thresh, rather than the peak current threshold represented by the signal Ipk_thresh.

The estimate of Iripple/2 will have a degree of error or inaccuracy, for reasons such as a tolerance in the rated inductance of the inductor 110, derating of the inductor 110 and/or error in the measurement of VDD_B, and so the signal Iavg_thresh will not represent the actual average inductor current Iavg with complete accuracy.

FIG. 8 shows one example of circuitry which uses an estimate of Iripple/2 in order to produce a signal indicative of a requested or target average inductor current from a signal that is indicative of a peak current, but those of ordinary skill in the art will readily understand that alternative circuitry could also be used to achieve the same effect. Such alternative circuitry need not include a control loop, but may instead operate in an open-loop manner, for example. Thus it is to be understood that the present disclosure is not limited to the specific example illustrated in FIG. 8, but encompasses any circuitry that applies an estimate of Iripple/2 in order to produce a signal indicative of a requested or target average inductor current.

In some applications it may be beneficial to compare the actual inductor current in boost converter circuitry to a requested or target average inductor current, to determine whether the actual inductor current is higher or lower than the requested average inductor current.

Figure 9:
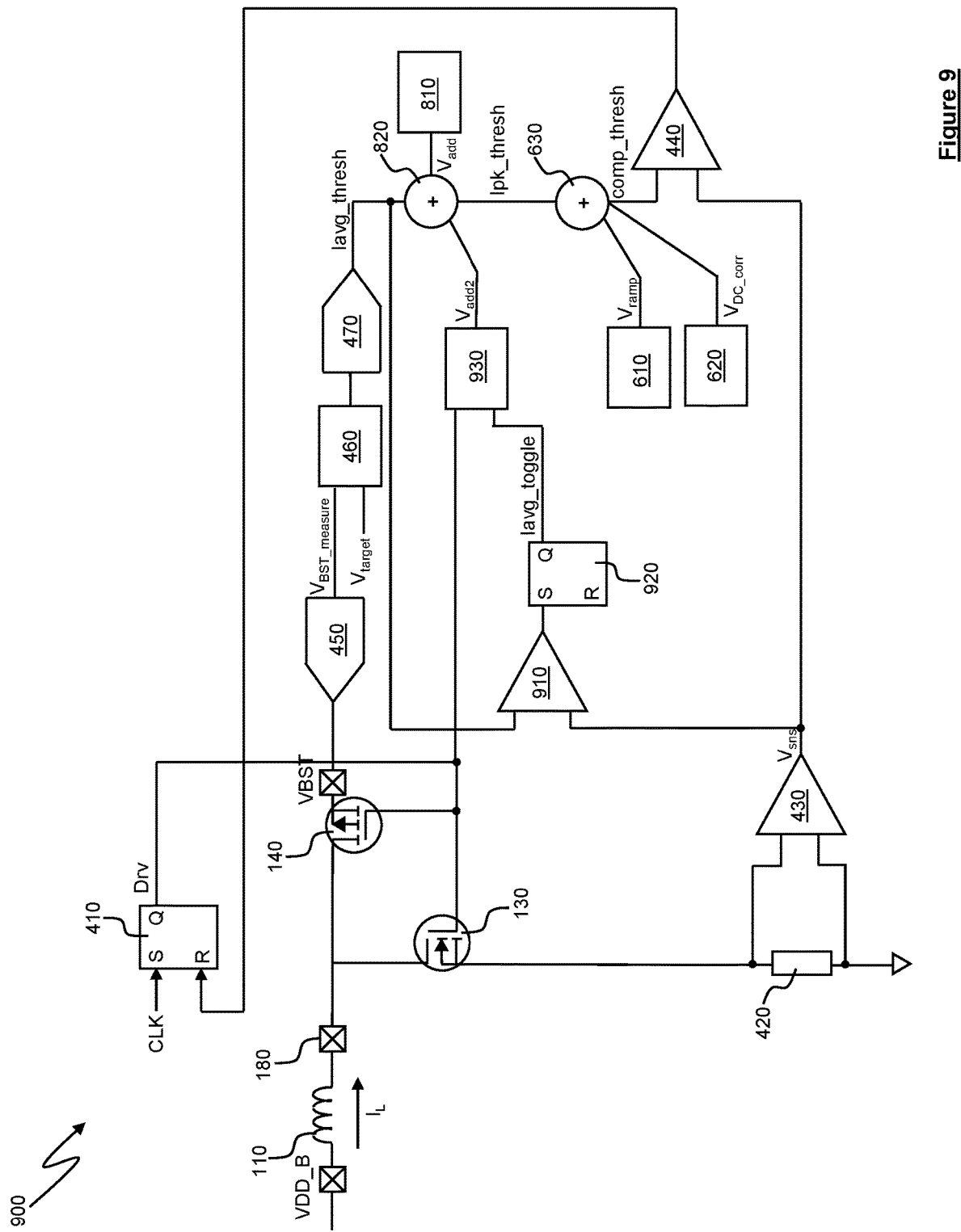
FIG. 9 is a schematic representation of further alternative boost converter circuitry having a control loop.

FIG. 9 is a schematic representation of boost converter circuitry that includes circuitry for compensating, at least partially, for error in the estimate of Iripple/2 such that the signal Iavg_thresh is a more accurate representation of the actual average inductor current.

The boost converter circuitry, shown generally at 900 in FIG. 9, includes a number of elements in common with the boost converter circuitry 800 of FIG. 8. Such common elements are denoted by common reference numerals in FIGS. 8 and 9, and will not be described again here. Again, the ramp generator circuitry 610 and the DC correction voltage generator circuitry 620 could be omitted from the boost converter circuitry 800.

The boost converter circuitry 900 in this example includes comparator circuitry 910 configured to compare the signal Vsns output by the amplifier circuitry 430 (which is indicative of the instantaneous current through the inductor 110) to the signal Iavg_thresh output by the DAC circuitry 470 (which is indicative of an average current threshold for the boost converter circuitry 900) and to output a comparator output signal when the level of the signal Vsns meets (i.e. is equal to) the level of the signal Iavg_thresh.

In the example shown in FIG. 9, an output of the comparator circuitry 910 is coupled to an input of latch circuitry 920 which, in the illustrated example, comprises SR flip-flop circuitry. The latch circuitry 920 is configured to output a latch output signal Iavg_toggle to an input of digital comparison circuitry 930 when the comparator output signal is received at the input of the latch circuitry 920, indicating that the current through the inductor 110 has reached the average current threshold. In other implementations the latch circuitry 920 may be omitted and the output of the comparator circuitry 910 may be coupled to the input of the digital comparison circuitry 930.

The digital comparison circuitry 930, which is operative to compare a time taken for the current through the inductor 110 (as indicated by either the latch output signal Iavg_toggle or the comparator output signal) to reach the average current threshold to a period of time equal to half of the duration of the gate drive signal Drv that causes the first switch 130 to switch on. Thus the digital comparison circuitry 930 is operative to compare the requested or target average inductor current to the actual inductor current to determine whether the actual average inductor current is higher or lower than the requested or target average inductor current.

Based on the comparison, the digital comparison circuitry outputs a second additional DC voltage Vadd2 to the second adder circuitry 820, to cause the digital control circuitry 460 to further modify its output signal, as will now be explained with reference to FIG. 10, which is a schematic representation of example circuitry for implementing the digital comparison circuitry 930 of FIG. 9.

Figure 10:
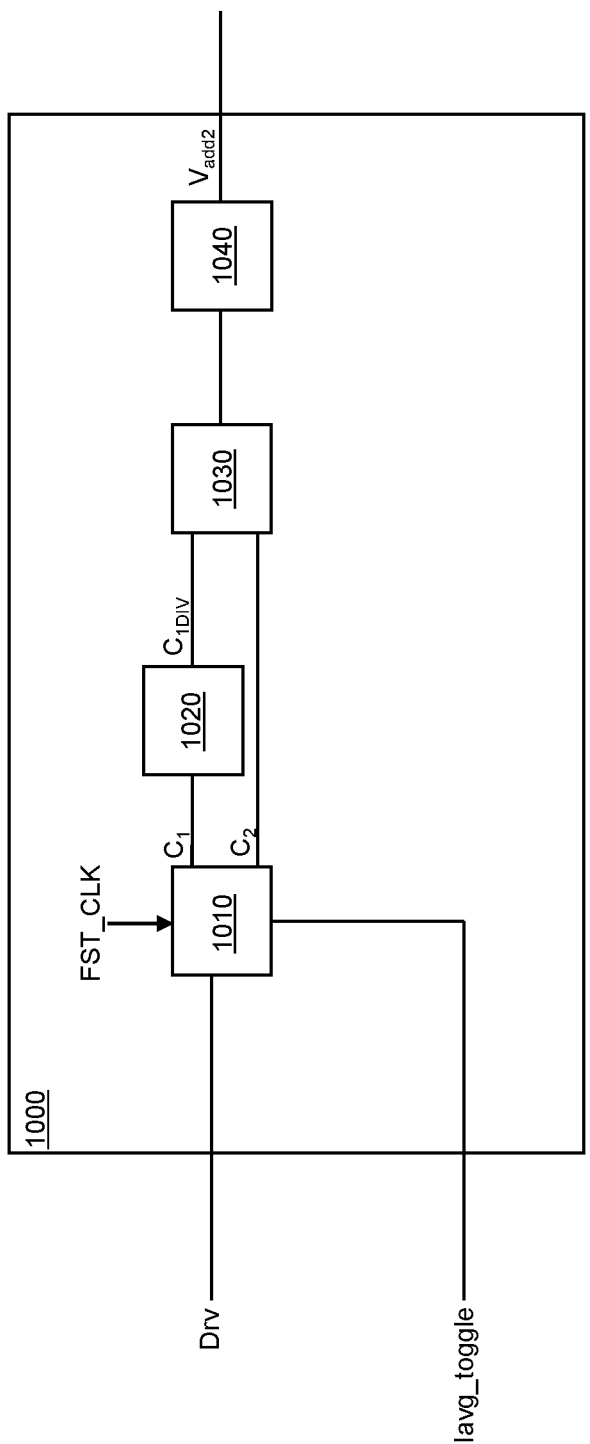
FIG. 10 is a schematic representation of digital comparison circuitry for the boost converter circuitry of FIG. 9.

The digital comparison circuitry, shown generally at 1000 in FIG. 10, comprises digital counter circuitry 1010 configured to receive, at a clock input terminal, a relatively fast clock signal FST_CLK, having a clock frequency $F_{CLK}$, from a clock signal generator (not shown in FIG. 10), which may be part of the digital comparison circuitry 930 or may be external to the digital comparison circuitry 930, and to generate an output count value indicative of the number of clock pulses of the clock signal FST_CLK that have been counted in a given period of time. The digital counter circuitry 1010 also includes first and second input terminals. In use of the circuitry 1000, the first input terminal is coupled to the output of the controller circuitry 410 so as to receive the gate drive signal Drv output by the controller circuitry 410, and the second input terminal is coupled to the output of the latch circuitry 920 so as to receive the Iavg_toggle signal.

A first output of the digital counter circuitry 1010 is coupled to an input of digital divider circuitry 1020 such that the digital divider circuitry 1020 receives a first count value $C_1$, output by the digital counter circuitry 1010, and indicative of a duration of the charging phase $\phi_1$ of the boost converter circuitry 900. The digital divider circuitry 1020 is configured to divide the count value received from the digital counter circuitry 1010 by two, and to output a divided count value $C_{1DIV}$.

An output of the digital divider circuitry 1020, which outputs the divided count value $C_{1DIV}$, is coupled to a first input of digital comparator circuitry 1030. A second input of the digital comparator circuitry 1030 is coupled to a second output of the digital counter circuitry 1010 so as to receive a second count value $C_2$, indicative of the time taken for the inductor current to reach the average current threshold level represented by the signal Iavg_thresh.

An output of the digital comparator circuitry 1030 is coupled to an input of digital accumulator circuitry 1040, which generates an accumulator output as the second additional DC voltage $V_{add2}$.

Figure 11:
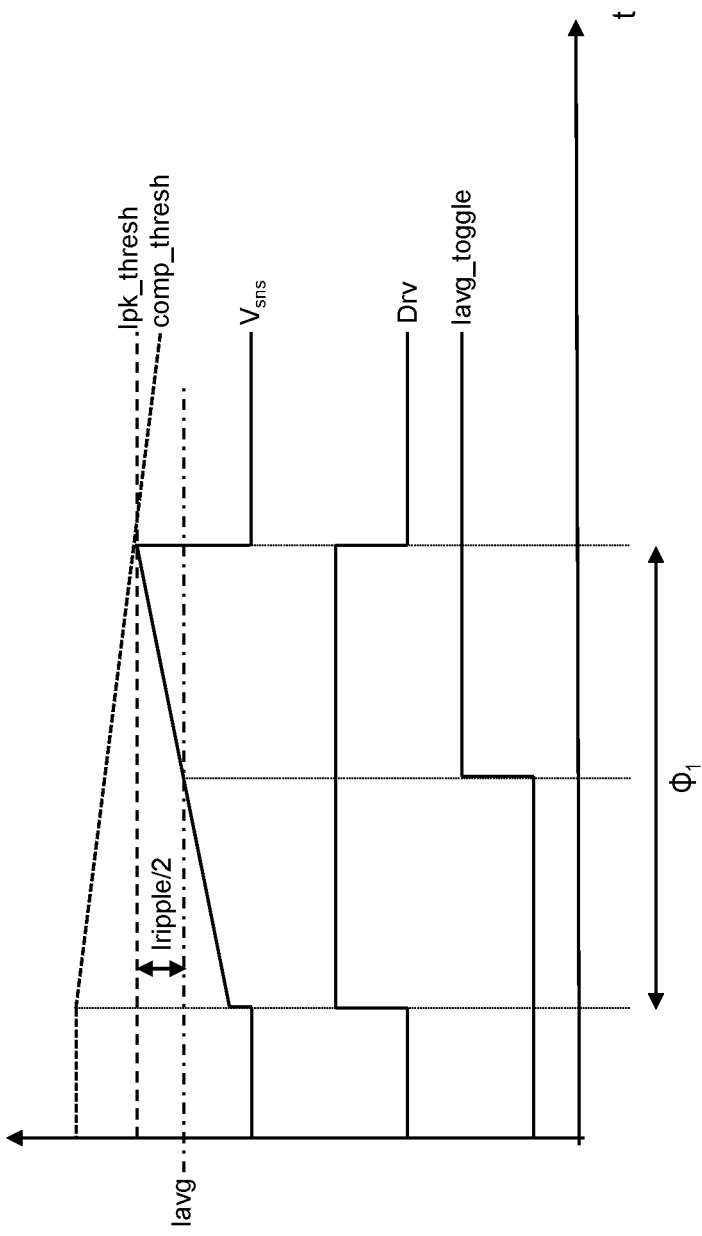
FIG. 11 is a schematic representation of signals in the boost converter circuitry of FIG. 9 during operation thereof.

If it is assumed that the current through the inductor 110 increases linearly during the charging phase $\phi_1$, the instantaneous current through the inductor 110 will reach the cycle average inductor current level Iavg exactly half way through the charging phase $\phi_1$. Thus if the average current threshold (represented by the signal Iavg_thresh) is accurate (in the sense that it is equal to the actual cycle average inductor current Iavg), then Iavg_toggle will be output by the latch circuitry 920 at a point in time exactly half way through the charging phase $\phi_1$ as shown in the signal diagram of FIG. 11. If Iavg_toggle is output by the latch circuitry 920 before half the duration of the charging phase $\phi_1$ has elapsed, then the average current threshold is too low and should be increased, whereas if Iavg_toggle is output by the latch circuitry 920 after half the duration of the charging phase $\phi_1$ has elapsed, then the average current threshold is too high and should be decreased.

Thus, by comparing the time taken for the Iavg_toggle signal to be output by the latch circuitry 920 to half of the duration of the charging phase 1, a difference between the average current threshold (represented by the signal Iavg_thresh) and the actual cycle average inductor current Iavg can be determined, and the result of this determination can be used to compensate for error in the estimate of Iripple/2, to make the signal Iavg_thresh a more accurate representation of the actual cycle average inductor current.

In operation of the circuitry 1000, the digital counter circuitry 1010 commences counting clock pulses for a particular operational cycle of the boost converter circuitry 900 when it receives the gate drive signal Drv output by the controller circuitry 410 to turn the first switch 130 on at the beginning of the particular operational cycle. Thus the digital counter circuitry 1010 commences counting clock pulses at the beginning of the particular operational cycle of the boost converter circuitry 900.

The digital counter circuitry 1010 stops counting clock pulses for the particular operational cycle when it stops receiving the gate drive signal Drv (i.e. when the first switch 130 is switched off at the end of the charging phase $\phi_1$) and outputs (e.g. to an internal register of the digital counter circuitry 1010, or to a register external to the digital counter circuitry 1010) a count value that has been reached at this point in time.

Thus, the digital counter circuitry 1010 generates and outputs a first count value $C_1$ that is indicative of the duration of the charging phase $\phi_1$ of the boost converter circuitry 900.

The digital counter circuitry 1010 also receives the signal Iavg_toggle output by the latch circuitry 920, and outputs (e.g. to an internal register of the digital counter circuitry 1010, or to a register external to the digital counter circuitry 1010) a count value that has been reached at this point in time.

Thus, the digital counter circuitry 1010 generates and outputs a second count value $C_2$ that is indicative of the time taken for the inductor current to reach the average current threshold level represented by the signal Iavg_thresh.

The digital comparator circuitry 1030 compares the second count value $C_2$ to the divided count value $C_{1DIV}$ to determine a difference between the time taken for the Iavg_toggle signal to be output by the latch circuitry 920 and half of the duration of the charging phase $\phi_1$. If the second count value $C_2$ is greater than the divided count value $C_{1DIV}$ (indicating that Iavg_toggle is output after half the charging phase $\phi_1$ has elapsed), the digital comparator circuitry 1030 outputs a signal to cause the digital accumulator circuitry 1040 to increase $V_{add2}$, thus causing Iavg_thresh to decrease (as a result of the action of the control loop), whereas if the second count value $C_2$ is less than the divided count value $C_{1DIV}$ (indicating that Iavg_toggle is output before half the charging phase $\phi_1$ has elapsed), the digital comparator circuitry 1030 outputs a signal to cause the digital accumulator circuitry 1040 to decrease $V_{add2}$, thus causing Iavg_thresh to increase (as a result of the action of the control loop).

Thus the circuitry of FIG. 10 is able to compensate for error in the estimate of Iripple/2 by increasing or decreasing the second additional DC voltage $V_{add2}$, so as to bring the average inductor current threshold closer to the actual average cycle inductor current Iavg, such that the signal Iavg_thresh is a more accurate representation of the actual cycle average inductor current Iavg.

In an alternative example the first output of the digital counter circuitry 1010 could be coupled directly to the first input of the digital comparator circuitry 1030, such that the first count value $C_1$ is not divided by two (and is therefore representative of the duration of the charging phase $\phi_1$) and a digital multiplier could be provided between the second output of the digital counter circuitry 1010 and the second input of the digital comparator circuitry 1030, to multiply the second count value $C_2$ by two to generate a multiplied count value $C_{2mult}$ (representative of time taken for the inductor current to reach the average current threshold level represented by the signal Iavg_thresh) that is output to the second input of the digital comparator circuitry 1030. As will be appreciated, comparing the undivided first count value $C_1$ to the multiplied count value $C_{2mult}$ is equivalent to comparing the divided count value $C_{1DIV}$ to the original second count value $C_2$.

As will be appreciated by those of ordinary skill in the art, in an alternative approach the time taken for the inductor current to fall to Iavg during the discharging phase $\phi_2$ could be compared to half the duration of the discharging phase $\phi_2$. If it is assumed that the current through the inductor 110 decreases linearly during the discharging phase $\phi_2$, the instantaneous current through the inductor 110 will reach the cycle average inductor current level Iavg exactly half way through the discharging phase $\phi_2$. Thus, instead of comparing the time for the instantaneous inductor current to reach Iavg to half the period of the charging phase $\phi_1$, the digital comparator circuitry 1030 could instead compare the time taken for the instantaneous inductor current to fall to or below Iavg to half the period of the discharging phase $\phi_1$ to determine if the average current is too low or too high, and output appropriate signals to cause the digital accumulator circuitry 1040 to increase or decrease $V_{add2}$ as necessary.

As will be appreciated by those of ordinary skill in the art, the signal Iavg_thresh generated by the boost converter circuitry 800, 900 of FIGS. 8 and 9 is indicative of the average inductor current over the combined duration of the charging and discharging phases $\phi_1$, $\phi_2$ when the boost converter circuitry 800, 900 is operating in continuous conduction mode (CCM).

However, for boost converter circuitry operating in discontinuous conduction mode (DCM), the signal Iavg_thresh is not indicative of the average inductor current over the whole of an operational cycle of the boost converter circuitry, i.e. the combined duration of the charging, discharging and zero-current phases $\phi_1$, $\phi_2$, $\phi_3$, but is instead indicative of the average inductor current over the charging and discharging phases $\phi_1$, $\phi_2$. As will be appreciated by those of ordinary skill in the art, the effect of the additional zero current phase $\phi_3$ is to reduce the cycle average inductor current when the boost converter circuitry is operating in DCM, as compared to the cycle average inductor current when the boost converter is operating in CCM, but the signal Iavg_thresh will not be indicative of this reduced cycle average inductor current when the boost converter circuitry 900 is operating in DCM.

In some applications it may be beneficial for the signal Iavg_thresh to reflect the average inductor current over the whole of an operational cycle of the boost converter circuitry, i.e. the combined duration of the charging, discharging and zero-current phases $\phi_1$, $\phi_2$, $\phi_3$ (i.e. over the period from $t_0$ to $t_3$ in FIG. 3), hereinafter referred to as the "DCM cycle average inductor current" when the boost converter circuitry 800, 900 is operating in DCM, rather than the average inductor current over the whole of an operational cycle of the boost converter circuitry.

This can be achieved by applying a scaling factor k to a signal in the boost converter circuitry, as will be discussed below with reference to FIGS. 12-14.

The scaling factor k is a ratio of the total period of an operational cycle of the boost converter circuitry to an "active period" of the operational cycle, where an "active period" is the period in which current flows through the inductor 110 during the operational cycle.

Figure 3:
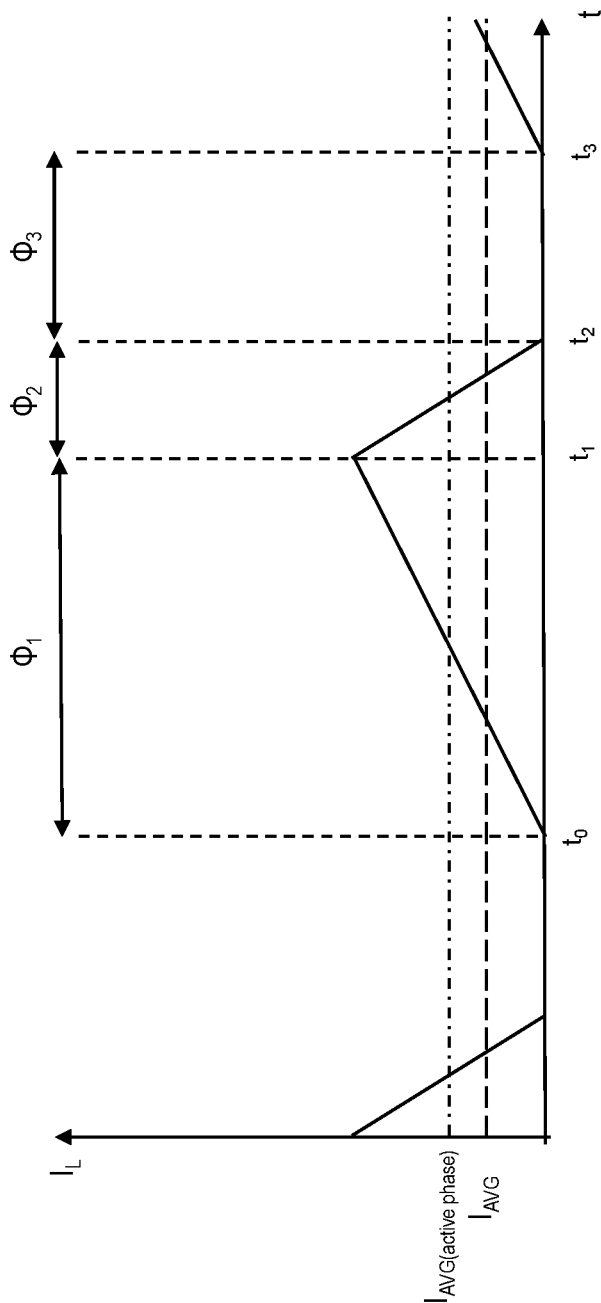
FIG. 3 is a graph illustrating current through the inductor of the boost converter circuitry of FIG. 1 during operation in a discontinuous conduction mode.

The scaling factor k exactly matches a ratio of the average inductor current over the total period of an operational cycle of the boost converter circuitry (shown as $I_{AVG}$ in FIG. 3) to the average inductor current in the active period of the operational cycle (shown as $I_{AVG(active\ phase)}$ in FIG. 3). By measuring the duration of the total period of an operational cycle and the duration of the active period of the operational cycle, the scaling factor k can be calculated, and this enables the calculation of the average inductor current over the total period of an operational cycle of the boost converter circuitry based on the average inductor current in the active period of the operational cycle.

Figure 2:
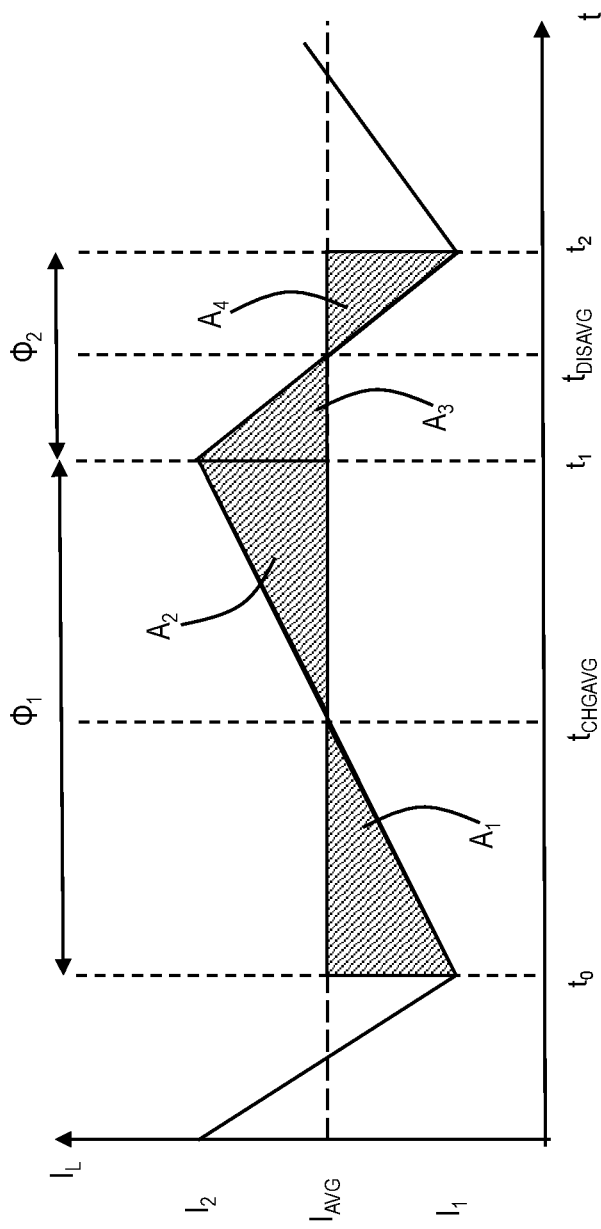
FIG. 2 is a graph illustrating current through the inductor of the boost converter circuitry of FIG. 1 during operation in a continuous conduction mode.

When the boost converter circuitry is operating in CCM, the total period of an operational cycle is equal to the duration of the period from $t_0$ to $t_2$ in FIG. 2, i.e. the sum of the durations of the charging and discharging phases $\phi_1$, $\phi_2$.

Because in CCM current continuously flows in the inductor 110, the active period of the operational cycle is also equal to the duration of the period from $t_0$ to $t_2$ in FIG. 2, and so in CCM $k=(t_3-t_0)/(t_2-t_0)=1$.

In contrast, when the boost converter circuitry is operating in DCM, the total period of an operational cycle is equal to the duration of the period from $t_0$ to $t_3$ in FIG. 3, i.e. the sum of the durations of the charging, discharging and zero-current phases $\phi_1$, $\phi_2$, $\phi_3$. However, in DCM no current flows in the inductor 110 during the zero-current phase $\phi_3$, and so the active period of the operational cycle is equal to the duration of the period from $t_0$ to $t_2$ in FIG. 3, and so in DCM $k=(t_3-t_0)/(t_2-t_0)>1$.

Figure 12:
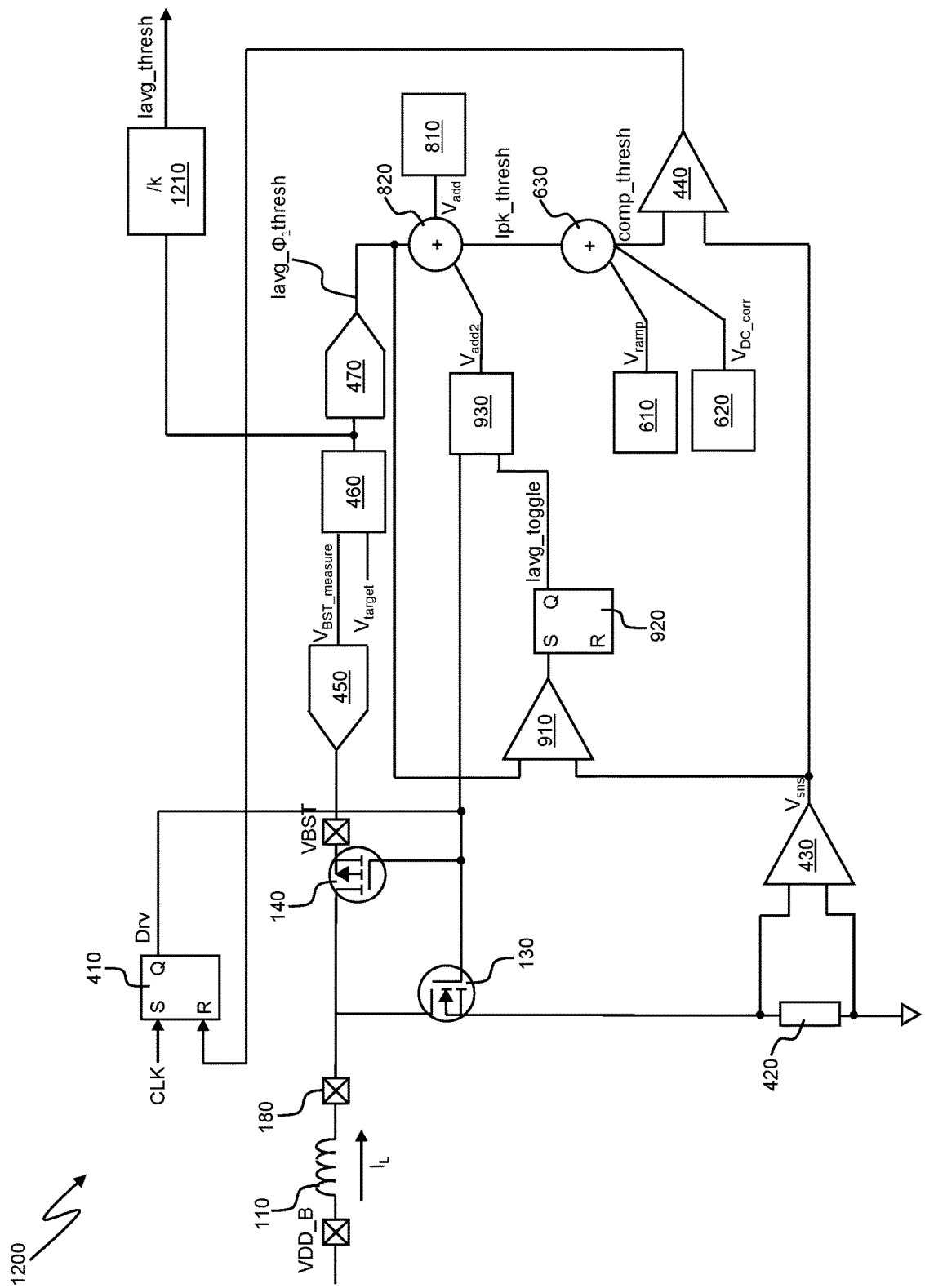
FIG. 12 is a schematic representation of boost converter circuitry including circuitry configured to generate a signal indicative of a cycle average inductor current over a whole operating cycle when the boost converter circuitry is operating in DCM.

FIG. 12 is a schematic representation of boost converter circuitry that includes circuitry for compensating for the effect of the zero-current phase $\phi_3$ when the boost converter circuitry is operating in DCM, to generate a signal Iavg_thresh that is indicative of the DCM cycle average inductor current.

The boost converter circuitry, shown generally at 1200 in FIG. 12, includes a number of elements in common with the boost converter circuitry 900 of FIG. 9. Such common elements are denoted by common reference numerals in FIGS. 9 and 11, and will not be described again here.

The boost converter circuitry 1300 additionally includes divider circuitry 1210 coupled to the output of the digital control circuitry 460 and configured to divide a digital signal Iavg_$\phi_1$thresh, indicative of the average inductor current over the charging and discharging phases $\phi_1$, $\phi_2$ during operation of the boost converter circuitry 1200 in DCM, by the scaling factor k, so as to generate a digital signal Iavg_thresh that is indicative of the DCM cycle average inductor current.

It will be recalled that the digital counter circuitry 1010 commences counting clock pulses for a first operational cycle of the boost converter circuitry 900 when it receives the gate drive signal Drv output by the controller circuitry 410 to turn the first switch 130 on at the beginning of the first operational cycle in order to generate and output the first and second count values $C_1$, $C_2$.

The digital counter circuitry 1010 may also generate a third count value $C_3$ that is indicative of the total period of an operational cycle of the boost converter circuitry, by outputting (e.g. to an internal register of the digital counter circuitry 1010, or to a register external to the digital counter circuitry 1010) the count value that has been reached the next time the digital counter circuitry 1010 receives the gate drive signal Drv to turn the first switch 130 on again at the beginning of a second operational cycle immediately following the first operational cycle.

Alternatively, if the frequency of the clock signal CLK received by the controller circuitry 410 is a known fixed division of the clock signal FST_CLK received by the digital counter circuitry, the third count value $C_3$ may be known and stored, e.g. in a suitable register internal or external to the digital counter circuitry 1010. As will be apparent from the foregoing discussion, when the boost converter circuitry is operating in DCM, the third count value $C_3$ is indicative of the period $t_3-t_0$ shown in FIG. 3.

In order to measure the duration of the active period of the operational cycle, a determination must be made as to when the active period ends, i.e. when the discharging phase $\phi_2$ has finished. To this end, the digital counter circuitry 1010 may generate a fourth count value C4 indicative of the duration of the active period when it detects or is notified that the second switch 140 has been turned off at the end of the discharging phase $\phi_2$, by outputting (e.g. to an internal register of the digital counter circuitry 1010, or to a register external to the digital counter circuitry 1010) the count value that has been reached at this point in time. As will be apparent from the foregoing discussion, when the boost converter circuitry is operating in DCM, the fourth count value $C_4$ is indicative of the period $t_2-t_0$ shown in FIG. 3.

Thus the scaling factor k can be calculated, e.g. by the digital counter circuitry 1010 or by some other processing circuitry, and can be used to generate a signal Iavg_thresh that is indicative of the DCM cycle average inductor current.

In operation of the boost converter circuitry 1200, the signal Ipk_thresh output by the second adder circuitry 820 is indicative of a target peak inductor current in the boost converter circuitry 1200. The control loop acts to maintain Ipk_thresh at a desired level, and as no inductor current flows in the zero-current phase $\phi_3$ when the boost converter circuitry 1200 is operating in DCM, it follows that the signal at the output of the DAC circuitry 470 (i.e. the signal Iavg_$\phi_1$thresh that is received at the first input of the second adder circuitry 820) must be indicative of the average inductor current in the active period of the operational cycle, since $V_{add}$ is indicative of the Iripple/2, which is half the difference between the peak current and the average current. The DAC circuitry 470 simply converts a digital input signal into an equivalent analog output signal, so the signal output by the digital control circuitry 460 must be a digital version of Iavg_$\phi_1$thresh.

As Iavg_$\phi_1$thresh=k·Iavg_thresh, dividing the signal output by the digital control circuitry 460 by k (in the divider circuitry 1210) yields an output signal Iavg_thresh, which is indicative of the DCM cycle average inductor current of the boost converter circuitry 1200 when it is operating in DCM. As will be appreciated, when the boost converter circuitry 1200 is operating in CCM, k=1 and so the Iavg_thresh signal is also indicative of the cycle average inductor current in CCM.

The Iavg_thresh signal output by the divider circuitry 1210 can be used by downstream circuitry (not shown), e.g. for reporting the cycle average inductor current of the boost converter circuitry 1200.

Figure 13:
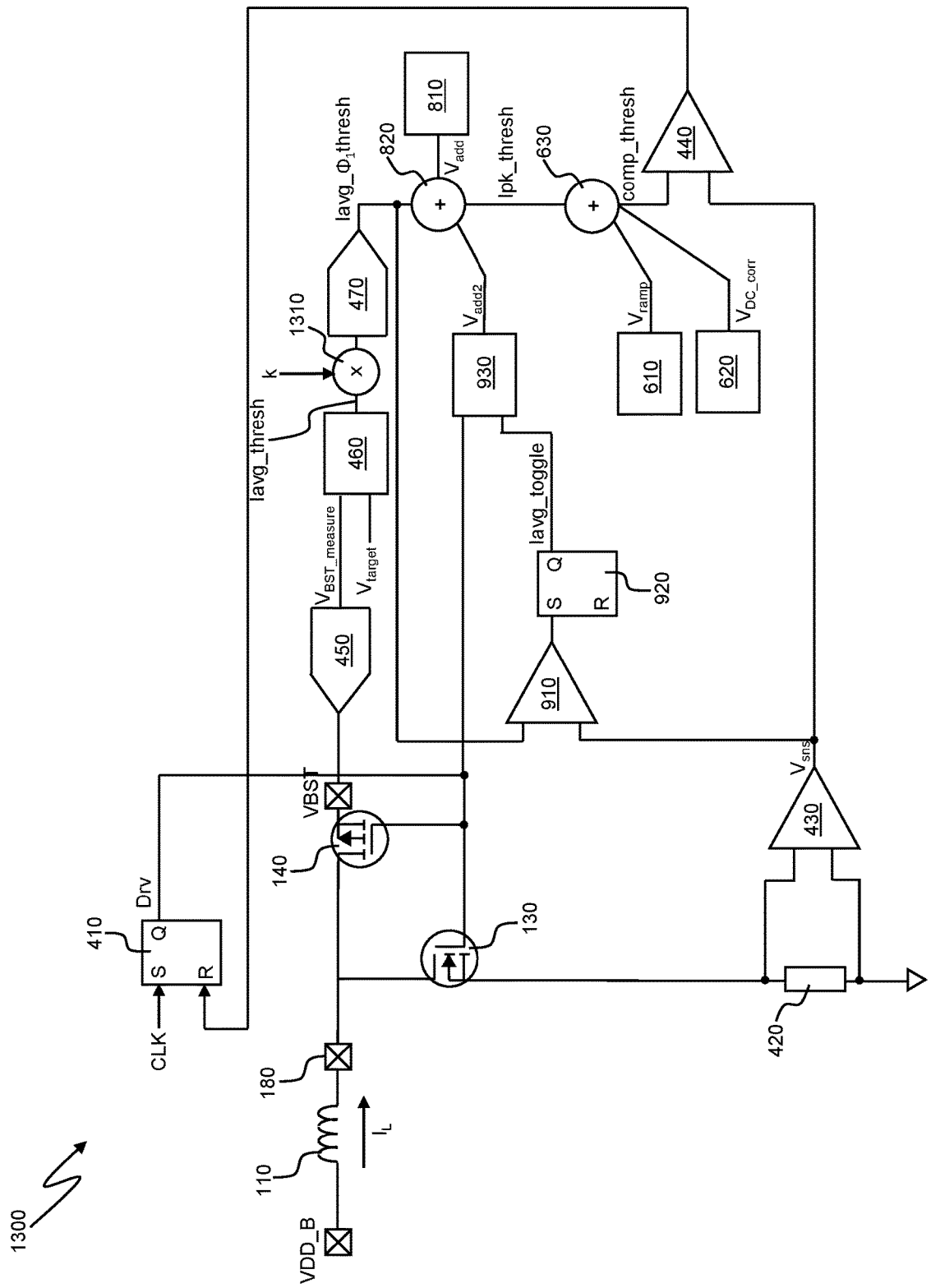
FIG. 13 is a schematic representation of boost converter circuitry including alternative circuitry configured to generate a signal indicative of a cycle average inductor current over a whole operating cycle when the boost converter circuitry is operating in DCM.

FIG. 13 is a schematic representation of alternative boost converter circuitry that includes circuitry for compensating for the effect of the zero-current phase $\phi_3$ on the cycle average inductor current when the boost converter circuitry is operating in DCM, to generate a signal Iavg_thresh that is indicative of the DCM cycle average inductor current.

The boost converter circuitry, shown generally at 1300 in FIG. 13, includes a number of elements in common with the boost converter circuitry 900 of FIG. 9. Such common elements are denoted by common reference numerals in FIGS. 9 and 13, and will not be described again here.

The boost converter circuitry 1300 additionally includes digital multiplier circuitry 1310 coupled between the output of the digital control circuitry 460 and the input of the DAC circuitry 470 and configured to multiply the signal output by the digital control circuitry 460 by the scaling factor k.

As in the boost converter circuitry 1200, in operation of the boost converter circuitry 1300, the signal Ipk_thresh output by the second adder circuitry 820 is indicative of a target peak inductor current in the boost converter circuitry 1300. The control loop acts to maintain Ipk_thresh at a desired level, and as no inductor current flows in the zero-current phase $\phi_3$ when the boost converter circuitry 1300 is operating in DCM, it follows that the signal at the output of the DAC circuitry 470 (i.e. the signal Iavg_$\phi_1$thresh that is received at the first input of the second adder circuitry 820) must be indicative of the average inductor current in the active period of the operational cycle, since $V_{add}$ is indicative of the Iripple/2, which is half the difference between the peak current and the average current.

Thus the signal received at the input of the DAC circuitry 470 must be equal to k·Iavg_thresh (since the multiplier circuitry 1310 multiples a signal received at its input by the scaling factor k). The signal output by the digital control circuitry 460 is therefore Iavg_thresh, which is indicative of the DCM cycle average inductor current of the boost converter circuitry 1300. As will be appreciated, in operation of the boost converter circuitry 1300 when it is operating in CCM, k=1 and so the Iavg_thresh signal is also indicative of the cycle average inductor current in CCM.

Again, the Iavg_thresh signal can be used by downstream circuitry (not shown), e.g. for reporting the cycle average inductor current of the boost converter circuitry 1300.

Figure 14:
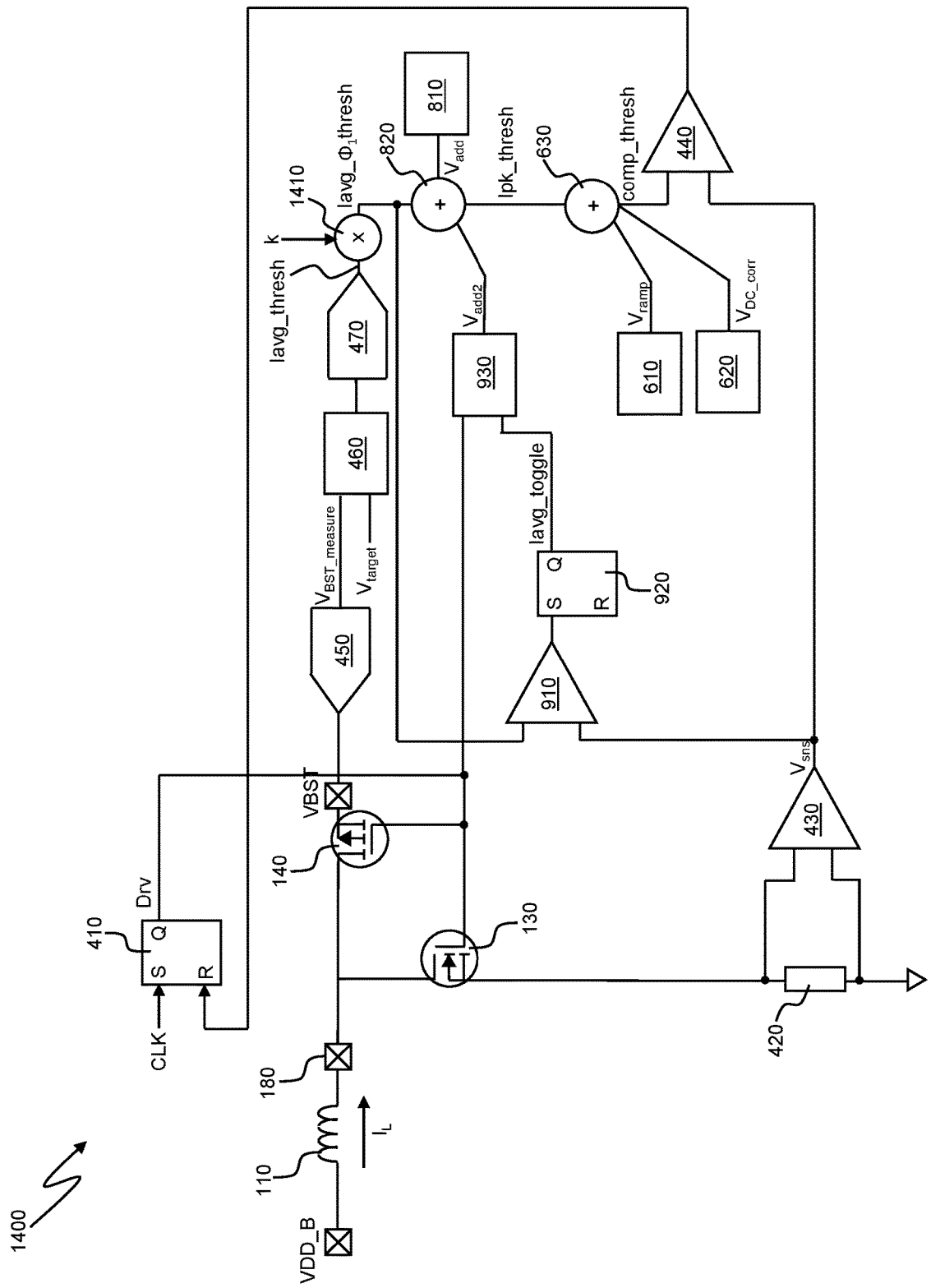
FIG. 14 is a schematic representation of boost converter circuitry including further alternative circuitry configured to generate a signal indicative of a cycle average inductor current over a whole operating cycle when the boost converter circuitry is operating in DCM.

FIG. 14 is a schematic representation of further alternative boost converter circuitry that includes circuitry for compensating for the effect of the zero-current phase $\phi_3$ on the cycle average inductor current when the boost converter circuitry is operating in DCM, to generate a signal Iavg_thresh that is indicative of the DCM cycle average inductor current.

The boost converter circuitry, shown generally at 1400 in FIG. 14, includes a number of elements in common with the boost converter circuitry 900 of FIG. 9. Such common elements are denoted by common reference numerals in FIGS. 9 and 14, and will not be described again here.

The boost converter circuitry 1400 additionally includes analog multiplier circuitry 1410 coupled between the output of the DAC circuitry 470 and the input of the second adder circuitry 820, and configured to multiply the signal output by the DAC circuitry 470 by the scaling factor k, to generate a scaled analog output signal which is output to the second adder circuitry 820. This scaling of the DAC output signal causes the control loop to settle to a steady state in which the signal Iavg_thresh output by the DAC circuitry 470 is indicative of the average inductor current over the whole period of the operational cycle.

As in the example illustrated in FIG. 13, in operation of the boost converter circuitry 1400, the signal Ipk_thresh output by the second adder circuitry 820 is indicative of a target peak inductor current in the boost converter circuitry 1400. The control loop acts to maintain Ipk_thresh at a desired level, and as no inductor current flows in the zero-current phase $\phi_3$ when the boost converter circuitry 1400 is operating in DCM, it follows that the signal at the output of the multiplier circuitry 1410 (i.e. the signal Iavg_$\phi_1$thresh that is received at the first input of the second adder circuitry 820) must be indicative of the average inductor current in the active period of the operational cycle, since $V_{add}$ is indicative of the Iripple/2, which is half the difference between the peak current and the average current.

Thus the signal received at the input of the multiplier circuitry 1410 from the DAC circuitry 470 must be equal to Iavg_thresh, which is indicative of the cycle average inductor current over the whole of the operational cycle of the boost converter circuitry 1400 when it is operating in DCM. As will be appreciated, in operation of the boost converter circuitry 1400 when it is operating in CCM, k=1 and so the Iavg_thresh signal is also indicative of the cycle average inductor current in CCM.

The Iavg_thresh signal can be used by downstream circuitry (not shown), e.g. for reporting the cycle average inductor current of the boost converter circuitry 1400.

As noted above, an estimate of the ripple current Iripple (i.e. the difference between the peak inductor current and the average inductor current during an operational cycle) can be generated based on the voltage VDD_B, the inductance L of the inductor 110 and the charging period of the inductor 110 in the charging phase $\phi_1$.

A nominal value Lnom for the inductance L of the inductor 110 may be provided to the additional DC voltage generator circuitry 810 (e.g. by setting a register of the additional DC voltage generator circuitry 810 during a production process for the circuitry 900 or a host device incorporating the circuitry 900). This nominal inductor value Lnom may be based on the rated inductance provided by a manufacturer of the inductor 110, or alternatively may be an estimated or measured inductance value that is determined, for example, during a production test process.

However, this nominal inductance value Lnom may not accurately represent the actual value Lactual of the inductance of the inductor 110, e.g., due to manufacturing tolerances inherent in the production of the inductor 110, and/or due to derating of the inductor, whereby the inductance of the inductor 110 changes over time and/or with use.

In some situations, it is beneficial to be able to determine or estimate the actual inductance Lactual of the inductor 110, e.g., to determine if the inductor 110 is derating, to notify a system (e.g. a host device) incorporating the circuitry 900 that the inductor 110 is running at or close to saturation, and/or to ensure that the circuitry 900 is not being run at or close to a specified minimum inductance.

Figure 15:
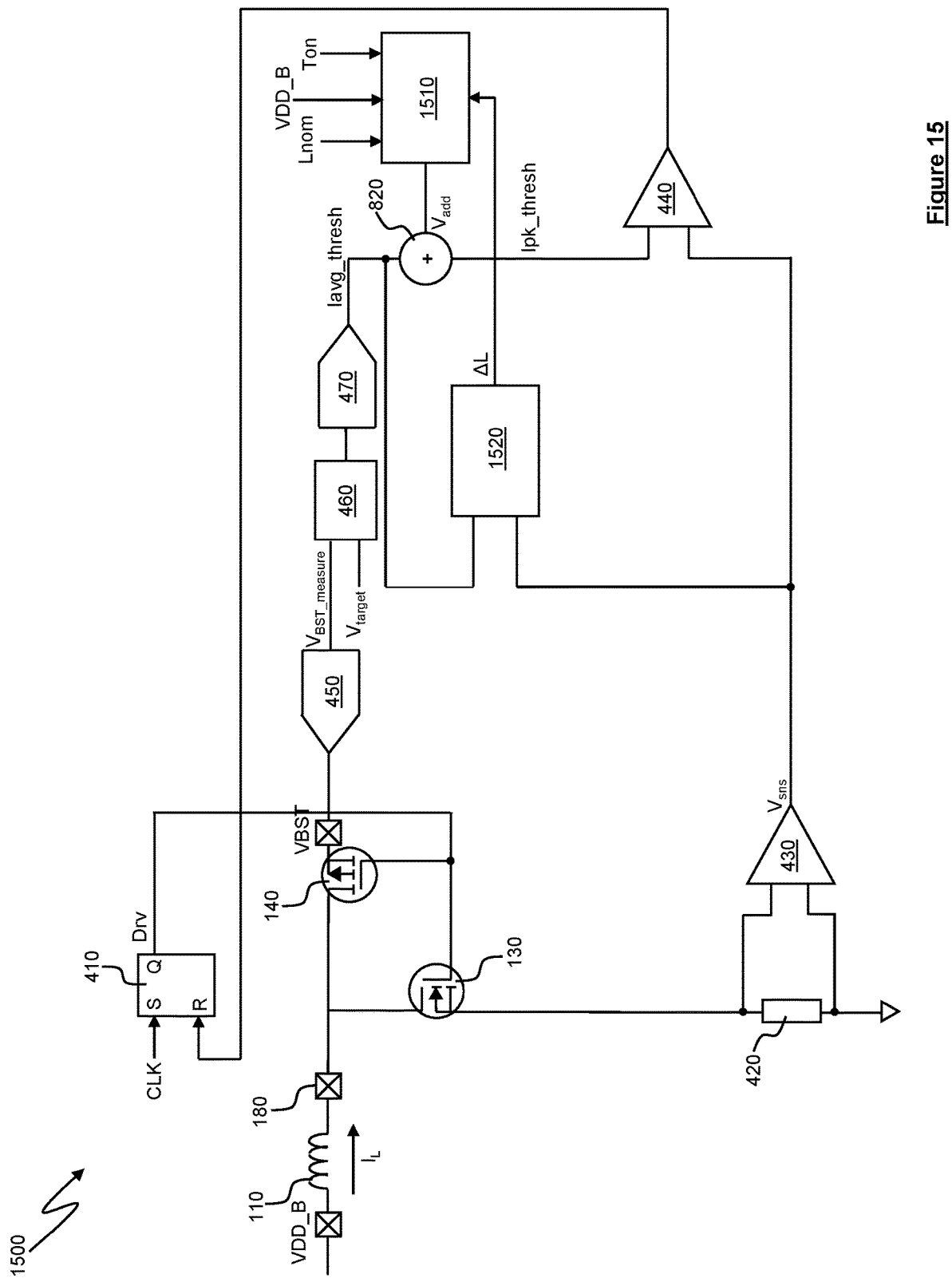
FIG. 15 is a schematic representation of alternative boost converter circuitry including circuitry for estimating an inductance of an inductor of the boost converter circuitry.

FIG. 15 is a schematic diagram illustrating further alternative boost converter circuitry that includes circuitry for estimating the actual inductance of the inductor 110.

The boost converter circuitry, shown generally at 1500 in FIG. 15, includes a number of elements in common with the boost converter circuitry 900 of FIG. 9. Such common elements are denoted by common reference numerals in FIGS. 9 and 15, and will not be described again here.

The boost converter circuitry 1500 includes DC voltage generator circuitry 1510, which is configured to receive the quantities VDD_B (the voltage across the inductor 110), Ton (the duration of the charging phase $\phi_1$) and L (the inductance of the inductor 110) and to generate an estimate of the ripple current Iripple according to the relationship Iripple= (VDD_B×Ton)/Lnom.

The DC voltage generator circuitry 1510 is further configured to generate and output an additional DC voltage $V_{add}$ (representative of Iripple/2) to be injected into the control loop by the second adder circuitry 820.

An initial estimate of the ripple current Iripple may be generated using the nominal inductance Lnom of the inductor 110 as the quantity L in the relationship above.

To estimate the actual inductance Lactual of the inductor 110, the additional DC voltage generator circuitry 1510 adjusts the value of the inductance L used to calculate the estimate of Iripple, such that the additional DC voltage $V_{add}$ injected into the control loop causes the average inductor current threshold Iavg_thresh to be equal to the actual average inductor current Iavg (once the loop has settled to a steady state). The value of the inductance L for which the average inductor current threshold Iavg_thresh is equal to the actual average inductor current is (or is a better representation of) the actual inductance Lactual of the inductor 110, and this value can be reported, e.g. to a processor of a host device, for use in determining whether the inductor 110 is derating, is at or close to a specified minimum inductance for the circuitry 900 or is at or close to saturation, for example.

Thus, the boost converter circuitry 1500 includes comparison circuitry 1520 configured to determine whether the actual inductor current Iavg differs from the target average inductor current Iavg_thresh and to output a signal ΔL indicative of whether the actual average inductor current Iavg is higher or lower than the target average inductor current Iavg_thresh to the additional DC voltage generator circuitry 1510.

For example, the comparison circuitry 1520 may output a signal ΔL1 at a first, relatively higher, signal level if the actual average inductor current is higher than the target average inductor current Iavg_thresh, and may output a signal ΔL2 at a second, relatively lower, signal level if the actual average inductor current is lower than the target average inductor current Iavg_thresh. If the actual average inductor current is lower than the target average inductor current Iavg_thresh the comparison circuitry 1520 may output a signal ΔL3 at a third level, different from the first and second levels, or alternatively may output no signal.

In some examples the comparison circuitry 1520 may comprise digital comparison circuitry 930 of the kind described above with reference to FIGS. 9 and 10. However, those of ordinary skill in the art will be aware of alternative circuitry (e.g. based on analog integrator circuitry) that is suitable for generating and outputting a signal indicative of whether the actual average inductor current Iavg is higher or lower than the target average inductor current Iavg_thresh.

The additional DC voltage generator circuitry 1510 may adjust (increase or decrease) the inductance value L in discrete steps (e.g. one step per operational cycle of the boost converter circuitry 1500) based on the signal ΔL received from the comparison circuitry 1520, and re-calculate Iripple and hence the Iripple/2 estimate using the adjusted value of L. The additional DC voltage $V_{add}$ based on the re-calculated Iripple/2 estimate is output by the additional DC voltage generator circuitry 1510. The target average inductor current value Iavg_thresh thus changes in response to the change in the inductance value L used to calculate Iripple.

The additional DC voltage generator circuitry 1510 may iterate the inductance value L (e.g. over a plurality of operational cycles) until a new inductance value Lnew is reached that causes the target average inductor current value Iavg_thresh to be equal to the actual average inductor current Iavg (when the loop has settled to a steady state).

This new inductor value Lnew is an accurate representation (or at least a more accurate representation than Lnom) of the actual inductance of the inductor 110, and can be used as described above, e.g. to determine whether the inductor 110 is derating, is at or close to a specified minimum inductance for the circuitry 900 or is at or close to saturation, for example.

In an alternative example, if the actual average inductor current differs from the target average inductor current Iavg_thresh, then a new Iripple/2 estimate may be calculated with Iavg in place of Iavg_thresh, if the actual average inductor current Iavg can be determined. The applicant's U.S. Pat. No. 10,720,835, which is incorporated herein by reference in its entirety, describes circuitry capable of determining the actual average current Iavg.

As explained above, Iripple/2=Ipk_thresh−Iavg_threshold. Ipk_thresh is a constant peak current threshold value. Substituting the actual average current value Iavg for the target average inductor current value Iavg_thresh yields a new Iripple/2 estimate, i.e.:

$$Iripplenew/2 = Ipk\_thresh - Iavg.$$

To determine the new inductance value Lnew, the additional DC voltage generator circuitry 1510 may make use of equation (3):

$$Lnew = (dt \times VDD\_B)/di, \text{ for the charging phase } \phi_1.$$

Here, dt is duration of the charging phase $\phi_1$, which is known to the digital control circuitry 460 (e.g. based on the first count value C1 output by the digital counter circuitry 1010). VDD_B is also known to the digital control circuitry 460. The di term in the equation above is provided by the newly calculated Iripplenew value.

$$\text{Thus, } Lnew = (dt \times VDD\_B)/Iripplenew.$$

In a further alternative example, a predetermined relationship or mapping between the voltage $V_{add}$ (i.e. the Iripple/2 estimate) and a change in the inductance value L may be known. A de-mapping function (e.g. a software routine) may be executable by the additional DC voltage generator circuitry 1510 to determine a change in the inductance value L based on a calculated value of $V_{add}$ that would cause the actual average inductor current Iavg to be equal to the target average inductor current Iavg_thresh. Thus, the de-mapping function may generate an output value that can be combined (e.g. added to) with the inductance value L to generate the new inductance value Lnew.

For verification, the new inductance value Lnew (however it is determined or selected) can be used by the digital control circuitry 460 to generate an Iripple/2 estimate that is used to generate the additional DC voltage $V_{add}$ that is injected into the control loop by the additional DC voltage generator circuitry 810. If (once the loop has settled), the target average inductor current value Iavg_thresh is equal to the actual average current Iavg, then the new inductor value Lnew is an accurate representation of the actual inductance of the inductor 110, and can be used as described above, e.g. to determine whether the inductor 110 is derating, is at or close to a specified minimum inductance for the circuitry 900 or is at or close to saturation, for example.

To determine whether the inductor is derating, the actual inductance value may be determined in the manner described above in response to specific trigger events (e.g. when a user of a host device adjusts a volume or the like) and/or at discrete time intervals (e.g., every week, month etc., or every time a host device incorporating the circuitry 900 is powered on), and compared to reference inductance value, which may be, for example, the rated inductance value of the inductor or an initial inductance value determined as described above on first powering on a host device incorporating the circuitry 900. If the actual inductance value differs from the reference inductance value by more than some threshold amount, a flag, alert or warning may be output to the host device, to cause the host device to instigate appropriate remedial or compensating action.

The principles of the present disclosure are described above with reference to boost converter circuitry, but it will be apparent to those of ordinary skill in the art that the principles of the present disclosure are equally applicable to other power converter circuitry, e.g. buck converter circuitry. Thus, the present disclosure is not limited to estimating current in boost converter circuitry, but also extends to estimating current in other power converter circuitry such as buck converter circuitry.

The circuitry described above with reference to the accompanying drawings may be incorporated in a host device such as a laptop, notebook, netbook or tablet computer, a gaming device such as a games console or a controller for a games console, a virtual reality (VR) or augmented reality (AR) device, a mobile telephone, a portable audio player or some other portable device, or may be incorporated in an accessory device for use with a laptop, notebook, netbook or tablet computer, a gaming device, a VR or AR device, a mobile telephone, a portable audio player or other portable device.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry for estimating an inductance of an inductor in power converter circuitry, the circuitry for estimating an inductance of an inductor comprising:
   circuitry for generating a peak inductor current signal indicative of a peak inductor current during an operational cycle of the power converter circuitry;
   circuitry for generating a ripple current estimate signal, indicative of an estimate of a ripple current in the power converter circuitry; and
   circuitry for applying the ripple current estimate signal to the peak inductor current signal to generate an average inductor current threshold signal indicative of an estimated average inductor current in the power converter circuitry during the operational cycle,
   wherein the ripple current estimate signal is based on:
      a duration of a charging phase of operation of the power converter circuitry;
      a voltage across the inductor; and
      an inductance value for the inductor;
   and wherein the circuitry for generating the ripple current estimate signal is operative to select an inductance value for the inductor for which the estimated average inductor current is equal to an actual average inductor current during the operational cycle to generate a value for the actual inductance of the inductor.

2. Circuitry for estimating an inductance of an inductor according to claim 1, wherein the circuitry for generating the ripple current estimate signal is operative to adjust the inductance value in discrete steps, and to select the inductance value for which the estimated average inductor current is equal to the actual average inductor current.

3. Circuitry for estimating an inductance of an inductor according to claim 1, wherein the circuitry for generating the ripple current estimate signal is operative to select the inductance value for the inductor based on:
   a ripple current estimate determined based on a difference between the peak inductor current and the actual average inductor current;
   the duration of the charging phase of operation of the power converter circuitry; and
   the supply voltage to the power converter circuitry.

4. Circuitry for estimating an inductance of an inductor according to claim 1, wherein the circuitry for generating the ripple current estimate signal is operative to select the inductance value for the inductor based on a predetermined relationship between the ripple current estimate and a change in the inductance value that would cause the estimated average inductor current to be equal to an actual average inductor current during the operational cycle.

5. Circuitry for estimating an inductance of an inductor according to claim 1, further comprising comparison circuitry for generating a signal indicative of whether the actual average inductor current differs from the estimated average inductor current.

6. Circuitry for estimating an inductance of an inductor according to claim 5, wherein the comparison circuitry is configured to compare:
   a first period equal to half the duration of a charging or discharging phase of the power converter circuitry, to
   a second period equal to a time taken for the inductor current in the power converter circuitry to reach the average current threshold.

7. Circuitry for estimating an inductance of an inductor according to claim 5, wherein the comparison circuitry is configured to compare:
   a first period equal to a duration of a charging or discharging phase of the power converter circuitry;
   to a second period equal to twice the time taken for the inductor current in the power converter circuitry to reach the average current threshold.

8. Circuitry for estimating an inductance of an inductor according to claim 5, wherein the comparison circuitry comprises digital counter circuitry configured to generate a first count value indicative of the first period and a second count value indicative of the second period.

9. Circuitry for estimating an inductance of an inductor according to claim 8, wherein the comparison circuitry further comprises digital comparison circuitry operative to compare the first count value to the second count value and to generate a comparator output signal based on the comparison.

10. Circuitry for estimating an inductance of an inductor according to claim 4, wherein the comparison circuitry further comprises current monitor circuitry configured to generate a signal indicative of the actual inductor current.

11. Circuitry for estimating an inductance of an inductor according to claim 1, wherein the circuitry for generating the peak inductor current signal comprises control circuitry configured to receive a first signal indicative of a target output voltage and a second signal indicative of an actual output voltage of the power converter circuitry and to generate the peak inductor current signal based on the first and second received signals.

12. Circuitry for estimating an inductance of an inductor according to claim 11, wherein the circuitry for applying the ripple current estimate signal is configured to generate and apply an additional DC voltage to the peak inductor current signal.

13. Circuitry for estimating an inductance of an inductor according to claim 11, further comprising comparator circuitry configured to compare a signal indicative of the actual average inductor current during operation of the power converter circuitry to a threshold that is based on the average inductor current threshold signal.

14. Circuitry for estimating an inductance of an inductor according to claim 13, wherein the control circuitry, the circuitry for applying the ripple current estimate signal, and the comparator circuitry form a control loop for regulating an output voltage of the power converter circuitry.

15. Circuitry for estimating an inductance of an inductor according to claim 1, wherein the power converter circuitry comprises boost converter circuitry.

16. An integrated circuit comprising circuitry for estimating an inductance of an inductor according to claim 1.

17. A host device comprising circuitry for estimating an inductance of an inductor according to claim 1.

18. A host device according to claim 17, wherein the host device comprises a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console a VR or AR device, a mobile telephone, a portable audio player or other portable device.

* * * * *